(12) United States Patent
Nishimura

(10) Patent No.: US 10,673,425 B2
(45) Date of Patent: Jun. 2, 2020

(54) SEMICONDUCTOR DEVICE

(71) Applicant: FUJI ELECTRIC CO., LTD., Kawasaki-shi, Kanagawa (JP)

(72) Inventor: Takeyoshi Nishimura, Nagano (JP)

(73) Assignee: FUJI ELECTRIC CO., LTD., Kawasaki-Shi, Kanagawa (JP)

(*) Notice: Subject to any disclaimer, the term of this patent is extended or adjusted under 35 U.S.C. 154(b) by 0 days.

(21) Appl. No.: 16/288,892

(22) Filed: Feb. 28, 2019

(65) Prior Publication Data

US 2019/0334515 A1 Oct. 31, 2019

(30) Foreign Application Priority Data

Apr. 26, 2018 (JP) .................................. 2018-085541

(51) Int. Cl.
*H03K 17/06* (2006.01)
*H01L 27/06* (2006.01)
*H03K 17/16* (2006.01)

(52) U.S. Cl.
CPC ....... *H03K 17/063* (2013.01); *H01L 27/0629* (2013.01); *H03K 17/162* (2013.01)

(58) Field of Classification Search
CPC ................................................. H03K 17/063; H03K 17/162; H01L 27/0629; H01L 29/0692; H01L 29/8611; H01L 29/0619; H01L 29/404; H01L 28/20; H01L 27/0676

See application file for complete search history.

(56) References Cited

U.S. PATENT DOCUMENTS

| 5,969,964 A | 10/1999 | Mangtani |
| 2003/0218186 A1 | 11/2003 | Hano |
| 2011/0140179 A1 | 6/2011 | Kusunoki et al. |
| 2013/0105866 A1* | 5/2013 | Kusunoki ........... H01L 27/0629 257/272 |
| 2016/0006427 A1* | 1/2016 | Jonishi ................ H01L 27/0629 327/109 |
| 2016/0300912 A1* | 10/2016 | Tanaka .................. H01L 29/405 |

FOREIGN PATENT DOCUMENTS

| JP | 2898272 B2 | 5/1999 |
| JP | 4397602 B2 | 1/2010 |
| JP | 4610941 B2 | 1/2011 |
| JP | 2011-129628 A | 6/2011 |
| JP | 5473511 B2 | 4/2014 |
| JP | 5754399 B2 | 7/2015 |

* cited by examiner

*Primary Examiner* — Syed I Gheyas
(74) *Attorney, Agent, or Firm* — Rabin & Berdo, P.C.

(57) ABSTRACT

A current limiting resistor opposes a p-type anode region of a bootstrap diode in a depth direction, across an insulating film. The current limiting resistor is configured by poly-silicon layers constituting poly-silicon resistors, and a poly-silicon connector that is a connector connected to a limiting resistor electrode. The poly-silicon layers are disposed further outside than is the poly-silicon connector and each has a first end connected to the poly-silicon connector. The poly-silicon layers each have a second end and a part that is toward the second end and that is in contact with an anode electrode via a contact hole. Further, the poly-silicon layers are disposed evenly between a part thereof connected to the poly-silicon connector and the contact hole.

15 Claims, 16 Drawing Sheets

SEMICONDUCTOR DEVICE

CROSS REFERENCE TO RELATED APPLICATIONS

This application is based upon and claims the benefit of priority of the prior Japanese Patent Application No. 2018-085541, filed on Apr. 26, 2018, the entire contents of which are incorporated herein by reference.

BACKGROUND OF THE INVENTION

1. Field of the Invention

Embodiments of the invention relate to a semiconductor device.

2. Description of the Related Art

Conventionally, in a gate drive circuit of a half-bridge circuit for power conversion such as an inverter circuit, a bootstrap circuit is commonly known that generates voltage that is higher than an internal power source voltage VCC of the gate drive circuit (for example, refer to Japanese Patent No. 5473511, Japanese Patent No. 5754399, Japanese Patent No. 4397602, Japanese Patent No. 4610941, and Japanese Patent No. 2898272). In a switching device on a high-potential side (high side: upper arm hereinafter) of a half-bridge circuit, a gate voltage boosted by a bootstrap circuit to a voltage that is higher than a drain voltage VDD of a switching power device of the upper arm is supplied, whereby the switching power device of the upper arm is turned ON completely. FIG. 15 is a circuit diagram of an equivalent circuit of some components of a general bootstrap circuit.

As depicted in FIG. 15, a bootstrap circuit 100 is constituted by a bootstrap diode (BSD) 101, a non-depicted bootstrap condenser (BSC), and a current limiting resistor 102. A positive electrode of the bootstrap condenser is connected to a cathode of the bootstrap diode 101 while a gate of the switching power device of a non-depicted upper arm is connected to a negative electrode of the bootstrap condenser. Between an internal power source and an anode of the bootstrap diode 101, the current limiting resistor 102 is connected in series to the bootstrap diode 101.

In the bootstrap circuit 100, when the switching device of the upper arm of the half-bridge circuit is in an ON state and a switching device on a low-potential side (low side: lower arm hereinafter) is in an OFF state, the bootstrap diode 101 conducts, and voltage that is a difference of voltage drops of the bootstrap diode 101 and the current limiting resistor 102 subtracted from the internal power source voltage VCC is charged by the bootstrap condenser. At this time, the switching device of the upper arm does not turn ON because the gate voltage is at zero potential.

Meanwhile, when the switching device of the upper arm of the half-bridge circuit is in the OFF state and the switching device of the lower arm is in the ON state, the gate voltage of the switching device of the upper arm is a voltage value obtained by adding the electric potential of the positive electrode of the bootstrap condenser to the drain voltage VDD of the switching device of the upper arm. As a result, the switching device of the upper arm is completely in the ON state. Operation of the bootstrap circuit 100 such as this is repeatedly performed at a period of a switching frequency input to the gate drive circuit.

A charging amount of the bootstrap condenser is determined by a mathematical product (time constant) of a capacity of the bootstrap condenser and a composite resistance value (=the resistance value R101 of the bootstrap diode 101+the resistance value R102 of the current limiting resistor 102) of a resistance value R101 of the bootstrap diode 101 and a resistance value R102 of the current limiting resistor 102. Therefore, the resistance value R102 of the current limiting resistor 102 has to be highly accurate (have little variation). Thus, as the current limiting resistor 102, a poly-silicon (poly-Si) resistor is used that enables a mathematical area of a semiconductor substrate (semiconductor chip) to be reduced without parasitic effects.

A poly-silicon resistor constituting the current limiting resistor 102 is disposed on a front surface of a semiconductor substrate (semiconductor chip) via an interlayer insulating film and is a single poly-silicon layer connected in series to the bootstrap diode 101 that is constituted by a pn junction formed on the same semiconductor substrate. Further, conventionally, a poly-silicon layer having a rectangular planar shape is used as the current limiting resistor 102. A reason for this is that sheet resistance is easily calculated from an aspect ratio (in particular, volume) of a rectangular surface of the poly-silicon layer and design of the current limiting resistor 102 from the sheet resistance is simple. Thus, the current limiting resistor 102 may be formed accurately to have the resistance value R102 desired (for example, refer to Japanese Laid-Open Patent Publication No. 2011-129628).

A structure of the bootstrap diode 101 and the current limiting resistor 102 of a conventional bootstrap circuit will be described. FIG. 16 is a plan view of a structure of the bootstrap diode and the current limiting resistor of a conventional bootstrap circuit as viewed from the front surface of the semiconductor substrate. FIG. 17 is a cross-sectional view along cutting line AA-AA' depicted in FIG. 16. FIGS. 16 and 17 correspond to FIGS. 6 and 7 of Japanese Laid-Open Patent Publication No. 2011-129628. As depicted in FIGS. 16 and 17, the bootstrap diode 101 and the current limiting resistor 102 of the bootstrap circuit 100 are provided on a single semiconductor substrate 110.

The bootstrap diode 101 is provided in a diode region 121 and is formed by pn junctions between a p-type anode region 113 and an n$^-$-type drift region 112 and an n$^+$-type cathode region 111. Semiconductor layers constituting the n$^+$-type cathode region 111 and the n$^-$-type drift region 112 are stacked and constitute the semiconductor substrate 110. The semiconductor substrate 110 has, as the front surface, a main surface on a side that includes the n$^-$-type drift region 112 and has, as a rear surface, a main surface on a side that includes the n$^+$-type cathode region 111. The p-type anode region 113 is selectively provided in the diode region 121, in a surface layer (surface layer of the n$^-$-type drift region 112) at the front surface of the semiconductor substrate 110. The p-type anode region 113 has a substantially rectangular planar shape.

In the p-type anode region 113, along an outer periphery of the p-type anode region 113, a p$^+$-type anode contact region 114 is selectively provided. The p$^+$-type anode contact region 114 has a substantially U-shaped planar shape that extends along 3 sides of the p-type anode region 113 having a substantially rectangular planar shape and surrounds a center part (inside) of the diode region 121. A poly-silicon layer that functions as the current limiting resistor 102 (hatched part) is provided on the front surface of the semiconductor substrate 110, via an oxide film 115. The current limiting resistor 102 is provided in the center part of the diode region 121 and opposes the p-type anode region 113 in a depth direction.

The current limiting resistor 102 has a substantially rectangular planar shape. The current limiting resistor 102 is covered by an interlayer insulating film 116. On the interlayer insulating film 116, an anode electrode 117a and a limiting resistor electrode 117b are disposed separated from each other. A contact hole 118a' constituting a contact (electrical contact) of the anode electrode 117a and the $p^+$-type anode contact region 114 is disposed penetrating the interlayer insulating film 116 and the oxide film 115 in the depth direction. Further, in the interlayer insulating film 116, a contact hole 118a constituting a contact for the anode electrode 117a and the current limiting resistor 102, and a contact hole 118b constituting a contact for the limiting resistor electrode 117b and the current limiting resistor 102 are provided.

The anode electrode 117a, similarly to the $p^+$-type anode contact region 114, has a substantially U-shaped planar shape and surrounds a periphery of the current limiting resistor 102. The anode electrode 117a is in contact with substantially an entire surface of the $p^+$-type anode contact region 114, via the contact hole 118a' that has a substantially U-shaped planar shape. Further, the anode electrode 117a is in contact with the current limiting resistor 102, via the contact hole 118a. In FIG. 16, a case is depicted in which the contact hole 118a and the contact hole 118a' are disposed separated from each other. In FIG. 17, a case is depicted in which the contact holes 118a, 118a' are continuous with each other.

The contact hole 118a constituting the contact for the anode electrode 117a and the current limiting resistor 102, and the contact hole 118b constituting the contact for the limiting resistor electrode 117b and the current limiting resistor 102 are each provided substantially linearly along one pair of opposing sides of the current limiting resistor 102 that has a substantially rectangular planar shape. The contact hole 118a constituting the contact for the anode electrode 117a and the current limiting resistor 102 is provided at a linear part (linear part having both ends respectively connected to other linear parts) that of 3 linear parts constituting the substantially U-shaped planar shape of the anode electrode 117a, is without an open end 119a.

The limiting resistor electrode 117b has a substantially rectangular planar shape having mathematical area that is smaller than that of the current limiting resistor 102. An entire surface of the limiting resistor electrode 117b opposes the current limiting resistor 102, across the interlayer insulating film 116 in the depth direction. The limiting resistor electrode 117b is in contact with the current limiting resistor 102, via the contact hole 118b. The limiting resistor electrode 117b is fixed at the internal power source voltage VCC. A periphery of the diode region 121 is surrounded by an edge termination region 122. In FIG. 16, the limiting resistor electrode 117b is indicated by a dashed line that is coarsest while the anode electrode 117a is indicated by a dashed line that is finer than that of the limiting resistor electrode 117b. The contact holes 118a, 118b are indicated by dashed lines finer than that of the anode electrode 117a.

SUMMARY OF THE INVENTION

According to an embodiment of the present invention, a semiconductor device includes a first semiconductor region of a second conductivity type selectively provided in a surface layer at a front surface of a semiconductor substrate of a first conductivity type; a second semiconductor region of the first conductivity type, the second semiconductor region being a part of the semiconductor substrate excluding the first semiconductor region; a bootstrap diode formed by a pn junction between the first semiconductor region and the second semiconductor region; an insulating layer covering the front surface of the semiconductor substrate; a poly-silicon layer provided in the insulating layer, the poly-silicon layer opposing the first semiconductor region, across the insulating layer; a first electrode in contact with the first semiconductor region and the poly-silicon layer; a second electrode in contact with the poly-silicon layer; a third electrode provided on a rear surface of the semiconductor substrate, the third electrode being in contact with the second semiconductor region. A first connector of the first electrode and the first semiconductor region is disposed in a ring shape surrounding a periphery of the poly-silicon layer. A second connector of the first electrode and the poly-silicon layer is disposed inside a ring of the first connector, uniformly with respect to the first connector. A third connector of the second electrode and the poly-silicon layer is disposed further inside than the second connector, uniformly with respect to the second connector.

In the embodiment, the poly-silicon layer has: a first poly-silicon part having the second electrode and the third connector, and a plurality of second poly-silicon parts disposed further outside than the first poly-silicon part, each of the plurality of second poly-silicon parts having an inside end connected to the first poly-silicon part and having at an outside end, the second connector connected with the first electrode. The plurality of second poly-silicon parts is disposed uniformly with respect to the third connector.

In the embodiment, a width of the plurality of second poly-silicon parts is constant from a connection site connected with the first poly-silicon part, to the second connector.

In the embodiment, the plurality of second poly-silicon parts is connected in parallel between the third connector and the second connector.

In the embodiment, the first poly-silicon part has a circular planar shape. Each of the plurality of second poly-silicon parts extends toward an outside in a spiral-shape originating at the connection site connected with the first poly-silicon part and terminating at the second connector, the each of the plurality of second poly-silicon parts surrounding a periphery of the first poly-silicon part.

In the embodiment, the second connector is disposed an equal distance from the first connector.

In the embodiment, the third connector is disposed an equal distance from the second connector.

In the embodiment, the poly-silicon layer has a circular planar shape. The second connector is disposed an equal distance from the first connector in a ring shape. The third connector is disposed an equal distance from the second connector in a ring shape.

In the embodiment, the poly-silicon layer has a ring planar shape. The third connector is positioned further outside than an inner periphery of the poly-silicon layer.

In the embodiment, the poly-silicon layer is separated into a plurality of fan-like planar shapes.

In the embodiment, a surface area of the poly-silicon layer is at least 40% of a surface area of the first semiconductor region.

In the embodiment, the surface area of the poly-silicon layer is equal to the surface area of the first semiconductor region.

Other objects, features, and advantages of the present invention are specifically set forth in or will become appar-

DETAILED DESCRIPTION OF THE INVENTION

Figure 1:
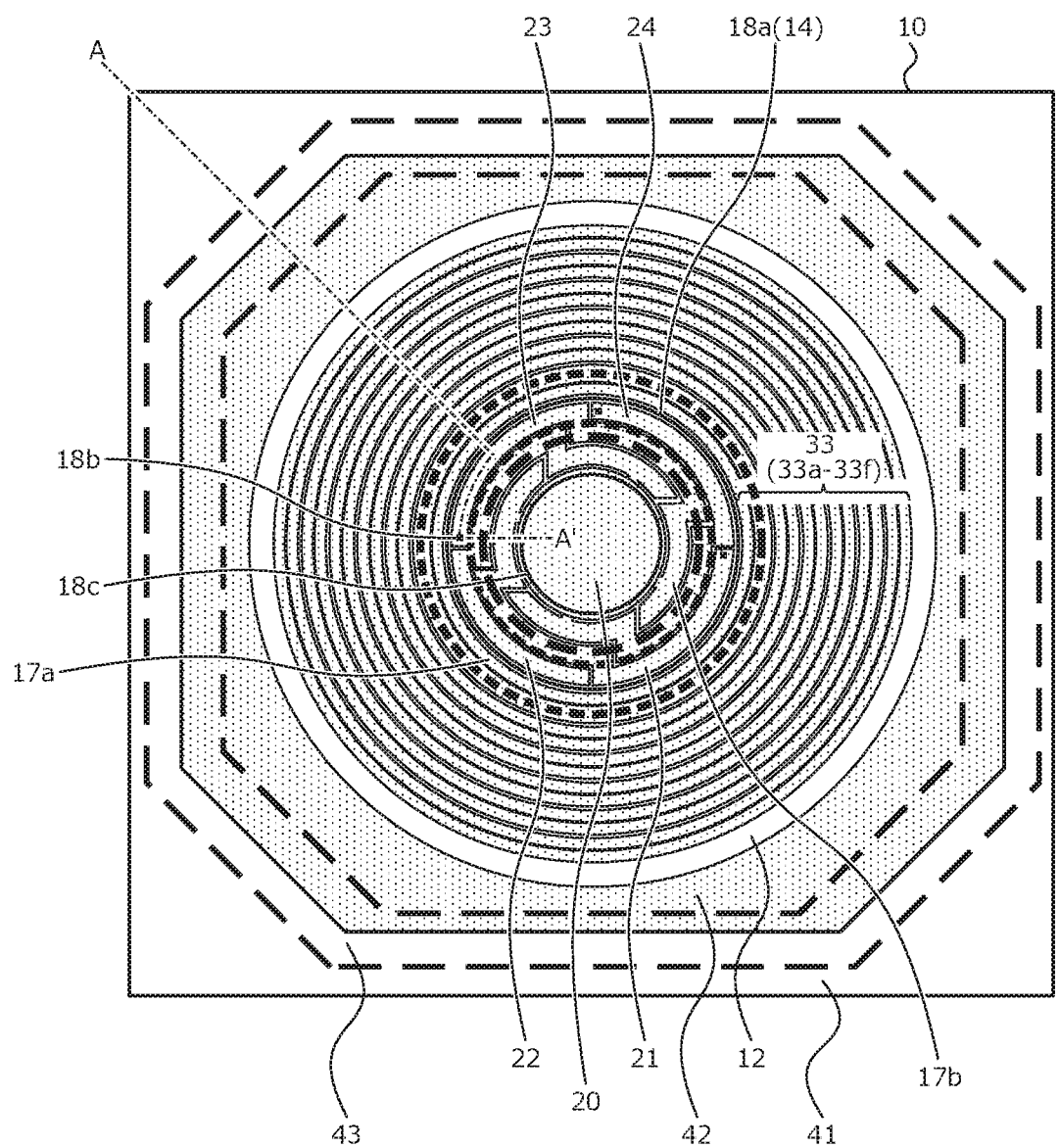
FIG. 1 is a plan view of a layout of a semiconductor device according to a first embodiment as viewed from a front surface of the semiconductor substrate.

First, problems associated with the related techniques above will be discussed. In the conventional bootstrap circuit, a part 130 of the contact hole 118a' constituting the contact for the anode electrode 117a and the p+-type anode contact region 114, the part 130 on a side of the contact hole 118a' with the open end 119a, does not oppose the contact hole 118a in a direction from the center part (inner side) of the diode region 121 toward the edge termination region 122 (outer side), the contact hole 118a constituting the contact for the anode electrode 117a and the current limiting resistor 102. Therefore, lengths of current paths (hole movement paths) from the current limiting resistor 102 to the bootstrap diode 101 differ at the front surface of the semiconductor substrate 110.

In other words, lengths of movement paths of electrons flowing from the contact hole 118a' constituting the contact for the anode electrode 117a and the p+-type anode contact region 114, to the contact hole 118a that constitutes the contact for the anode electrode 117a and the current limiting resistor 102 differ at the front surface of the semiconductor substrate 110. For example, a movement path 131 of electrons flowing from the open end 119a of the contact hole 118a' that constitutes the contact for the anode electrode 117a and the p+-type anode contact region 114, to the contact hole 118a constituting the contact for the anode electrode 117a and the current limiting resistor 102 is longest.

As a result, electrons moving from the open end 119a side of the contact hole 118a' that constitutes the contact for the anode electrode 117a and the p+-type anode contact region 114, to the contact hole 118a that constitutes the contact for the anode electrode 117a and the current limiting resistor 102 concentrate at an end 132 of the contact hole 118a that constitutes the contact for the anode electrode 117a and the current limiting resistor 102. Therefore, a problem arises in that an amount of heat generated at the end of the current limiting resistor 102 is large compared to the amount of heat generated corresponding to the resistance value R102 that is based on the volume of the current limiting resistor 102, and the accuracy of the resistance value R102 of the current limiting resistor 102 is likely to fluctuate.

Embodiments of a semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, main portions that are identical will be given the same reference numerals and will not be repeatedly described.

Figure 2:
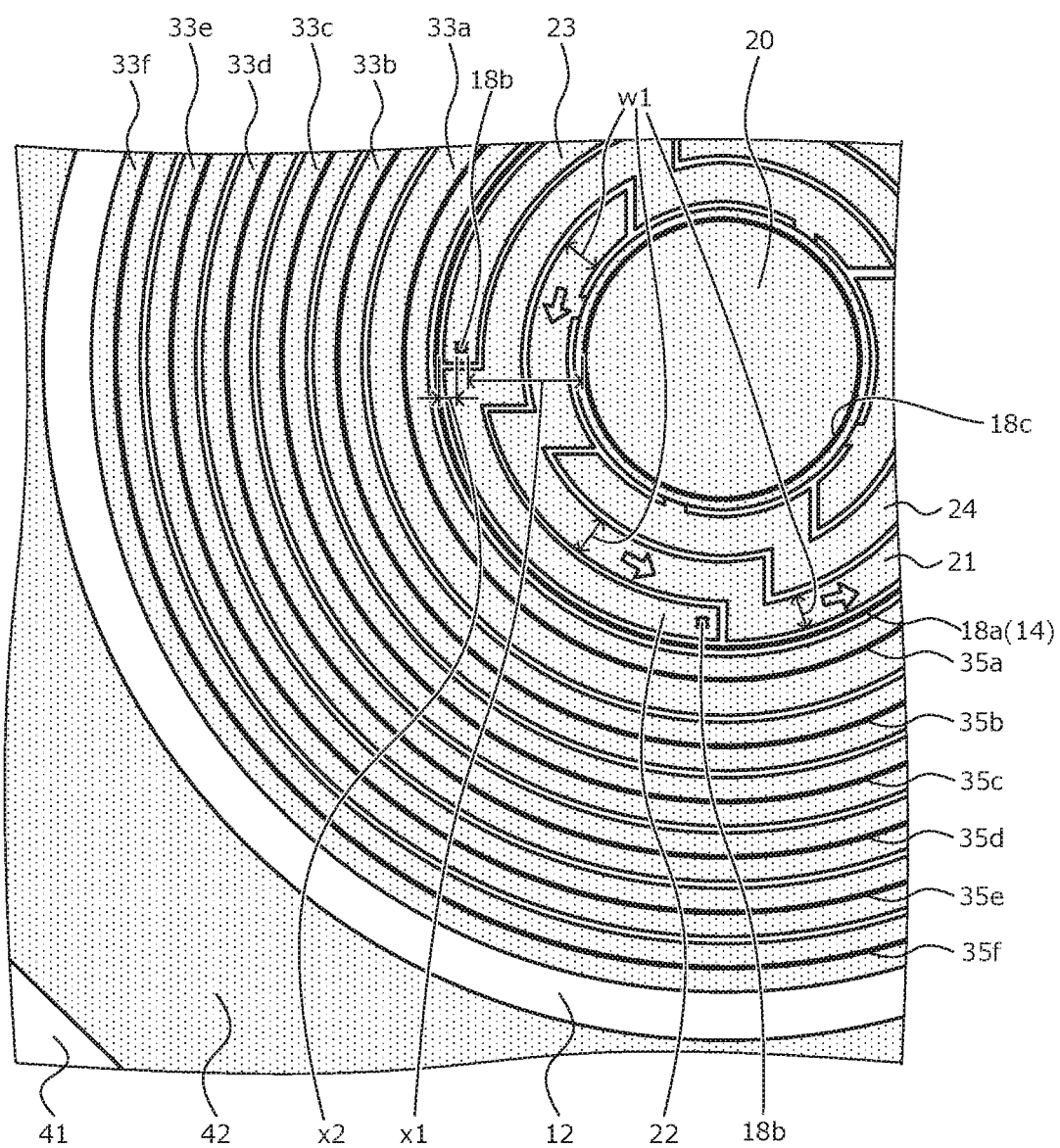
FIG. 2 is an enlarged plan view of a part of FIG. 1.
Figure 3:
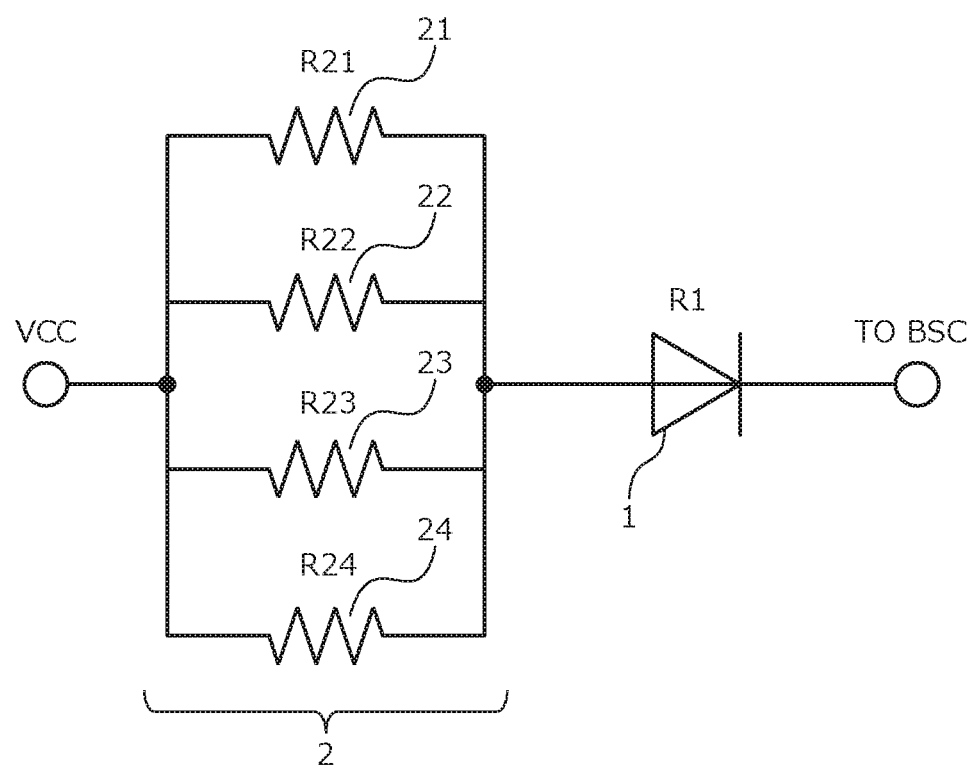
FIG. 3 is a circuit diagram of an equivalent circuit of the semiconductor device according to the first embodiment.
Figure 4:
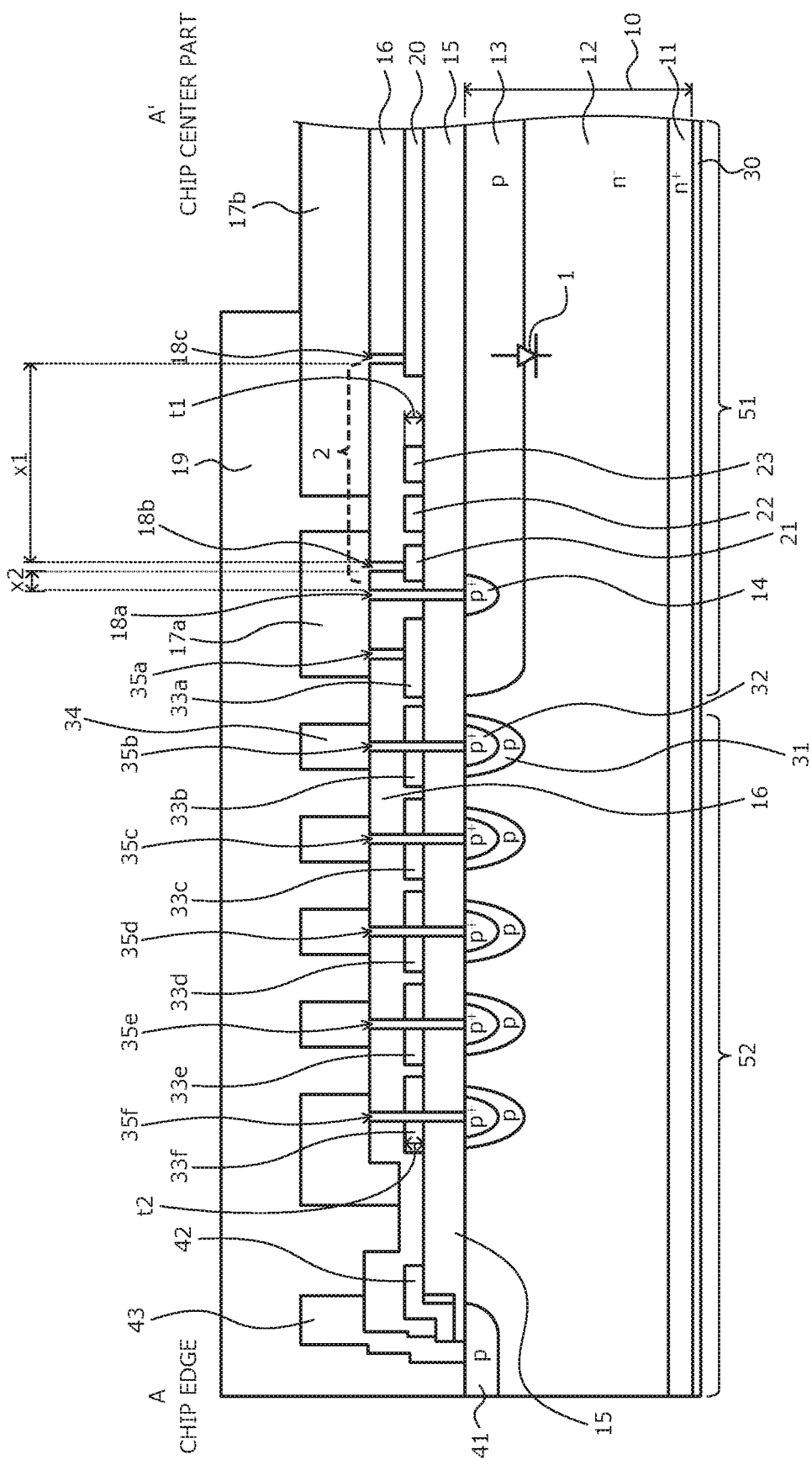
FIG. 4 is a cross-sectional view along cutting line A-A' in FIG. 1.
Figure 5:
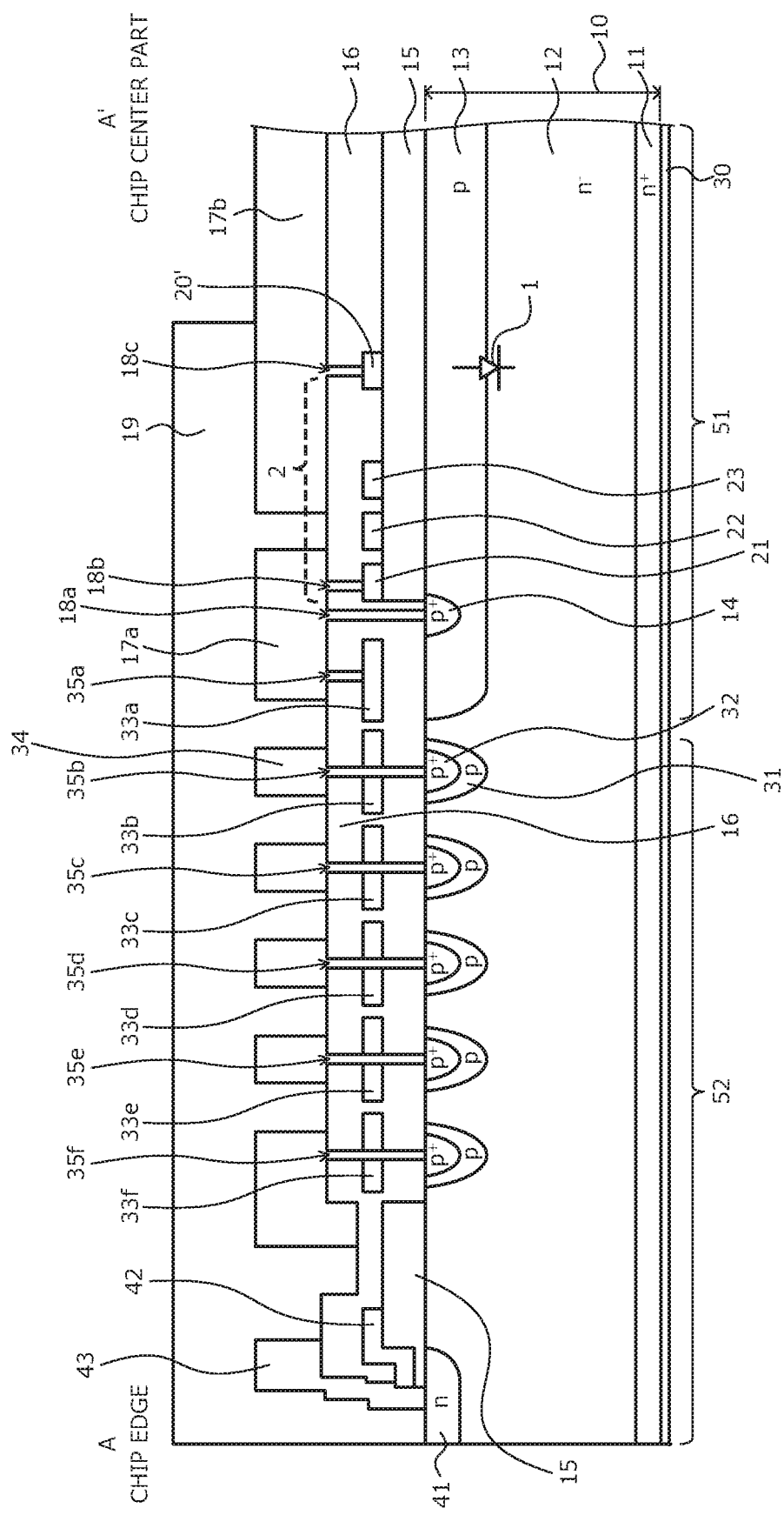
FIG. 5 is a cross-sectional view depicting an example of another structure along cutting line A-A' in FIG. 1.

A structure of the semiconductor device according to a first embodiment will be described. FIG. 1 is a plan view of a layout of the semiconductor device according to the first embodiment as viewed from a front surface of the semiconductor substrate. FIG. 2 is an enlarged plan view of a part of FIG. 1. In FIG. 2, a part of a current limiting resistor 2 in FIG. 1 is depicted enlarged. In FIGS. 1 and 2, an insulating film 15 and an interlayer insulating film 16 (refer to FIG. 4) on a front surface of a semiconductor substrate 10 are not depicted. FIG. 3 is a circuit diagram of an equivalent circuit of the semiconductor device according to the first embodiment. In FIG. 3, equivalent circuits of a bootstrap diode 1 and the current limiting resistor 2 in FIG. 1 are depicted. FIG. 4 is a cross-sectional view along cutting line A-A' in FIG. 1. FIG. 5 is a cross-sectional view depicting an example of another structure along cutting line A-A' in FIG. 1.

The semiconductor device according to the first embodiment and depicted in FIGS. 1 and 2 includes on the single semiconductor substrate (semiconductor chip) 10, the bootstrap diode (BSD) 1 and the current limiting resistor 2 constituting components of a bootstrap circuit (refer to FIGS. 3 and 4). The bootstrap circuit, for example, is built in a gate drive circuit of a half-bridge circuit for power conversion such as an inverter circuit. The bootstrap circuit boosts the internal power source voltage VCC of the gate drive circuit to a voltage higher than the drain voltage VDD of a switching device on a high-potential side (upper arm) of the half-bridge circuit, and has a function of generating gate voltage supplied to the switching device of the upper arm.

The bootstrap circuit is constituted by the bootstrap diode 1, the current limiting resistor 2, and a non-depicted bootstrap condenser (BSC). A charging amount (i.e., voltage of the bootstrap condenser) of the bootstrap condenser is determined by a composite resistance value of the bootstrap diode 1 and the current limiting resistor 2. The bootstrap diode 1 is configured by pn junctions of a p-type anode region 13 (a first semiconductor region) (refer to FIG. 4) and an n⁻-type drift region 12 (a second semiconductor region)

and an n⁺-type cathode region 11 described hereinafter (refer to FIG. 4). The p-type anode region 13, in a diode region, is disposed at the entire front surface of the semiconductor substrate 10. The diode region is a region in which the bootstrap diode 1 is disposed.

Further, while not depicted, the p-type anode region 13, for example, has a circular planar shape. In the p-type anode region 13, a p⁺-type anode contact region 14 is disposed in a substantially ring-shape along an outer periphery of the p-type anode region 13. The p⁺-type anode contact region 14 is in contact with an anode electrode 17a (a first electrode) described hereinafter, via a contact hole (a first connector) 18a. The contact hole 18a is disposed in a substantially ring-shape along the p⁺-type anode contact region 14. A diameter of the contact hole 18a is larger than an inner diameter of the anode electrode 17a and smaller than an outer diameter of the anode electrode 17a.

A poly-silicon (poly-Si) resistor constituting the current limiting resistor 2 is disposed on the front surface of the semiconductor substrate 10, with the insulating film 15 between the poly-silicon resistor and the semiconductor substrate 10. The insulating film 15, for example, is provided on the entire front surface of the semiconductor substrate and includes a contact hole. The insulating film 15, for example, may be an oxide film, a nitride film, or a stacked film thereof. The current limiting resistor 2 opposes the p-type anode region 13, across the insulating film 15 in the depth direction. Further, the current limiting resistor 2 is covered by the interlayer insulating film 16, and opposes the anode electrode 17a described hereinafter and a limiting resistor electrode (a second electrode) 17b in the depth direction, across the interlayer insulating film 16. The insulating film 15 and the interlayer insulating film 16 may correspond to an insulating layer covering the front surface of the semiconductor substrate 1.

The current limiting resistor 2 has a configuration in which the poly-silicon layer is separated so as to form plural parallel current paths between the p-type anode region 13 of the bootstrap diode 1 and the limiting resistor electrode 17b, when current flows from the limiting resistor electrode 17b, through the current limiting resistor 2, and toward the p-type anode region 13 of the bootstrap diode 1 (when holes move). In particular, the current limiting resistor 2 is constituted by plural (here, 4) poly-silicon layers 21, 22, 23, and 24 functioning as poly-silicon resistors, and a poly-silicon layer (hereinafter, poly-silicon connector) 20 that electrically connects the poly-silicon layers (second poly-silicon parts) 21 to 24 and the limiting resistor electrode 17b.

The poly-silicon connector 20, the poly-silicon layers 21 to 24, and poly-silicon layers 33a to 33f, 42 described hereinafter, for example, may be formed by patterning in a predetermined pattern, a poly-silicon layer deposited on an entire surface of the insulating film 15. In FIGS. 1 and 2, the plural poly-silicon layers that may be formed at the same process are indicated by hatching (similarly in FIGS. 6 and 7).

The poly-silicon connector 20, for example, is disposed at a chip center part. Further, the poly-silicon connector 20, for example, has a circular planar shape. The poly-silicon connector 20 is in contact with the limiting resistor electrode 17b, via a contact hole (a third connector) 18c. A diameter of the poly-silicon connector 20 is smaller than a diameter of the limiting resistor electrode 17b. The contact hole 18c constituting a contact (electrical contact) for the limiting resistor electrode 17b and the poly-silicon connector 20 is positioned closer to the poly-silicon connector 20 than is a contact hole (a second connector) 18b described hereinafter, and is uniformly disposed an equal distance x1 from each contact hole 18b, as explained later. In particular, the contact hole 18c, for example, is disposed in a ring-shape along an outer periphery of the poly-silicon connector 20. A diameter of the contact hole 18c is smaller than the diameter of the poly-silicon connector 20. The contact holes 18a-18c are formed in a concentric manner, centering around a center of the poly-silicon connector 20, and constitute concentric rings.

The poly-silicon layers 21 to 24 all have a planar shape that is substantially the same, and are disposed separated from each other. The poly-silicon layers 21 to 24 each have a first end connected to the outer periphery of the poly-silicon connector 20. Connectors for the poly-silicon connector 20 and the poly-silicon layers 21 to 24 may be disposed uniformly along the outer periphery of the poly-silicon connector 20, or may be variously modified according to resistance values of the poly-silicon layers 21 to 24. A part of the poly-silicon connector 20 further toward an outer side (toward a chip edge) than is the contact hole 18c functions as a poly-silicon resistor together with the poly-silicon layers 21 to 24.

The poly-silicon layers 21 to 24 each has a planar shape of a spiral originating from a part thereof connected to the poly-silicon connector 20 and terminating at the contact hole 18b described hereinafter, along the outer periphery of the poly-silicon connector 20, and extending toward the chip edge away from the poly-silicon connector 20 (in FIGS. 1 and 2, 3 spirals are depicted). The poly-silicon layers 21 to 24 surround a periphery of the poly-silicon connector 20 forming a ring-shape. A planar shape of the poly-silicon layers 21 to 24 may be a smooth continuous curve from the part connected to the poly-silicon connector 20 toward the chip edge, or as depicted in FIGS. 1 and 2, may have a zigzag-shape having portions where each poly-silicon layer having circular arc (curved) shapes of differing diameters from the part connected to the poly-silicon connector 20 toward the chip edge are connected and locally curved.

As a surface area of the poly-silicon layers 21 to 24 increases, heat dissipation at the poly-silicon layers 21 to 24 improves, and thus, is favorable. A sum (i.e., surface area of the current limiting resistor 2) of a total surface area of the poly-silicon layers 21 to 24 and a surface area of the poly-silicon connector 20, for example, is 40% or more of a surface area of the p-type anode region 13 and may be substantially equal to the surface area of the p-type anode region 13. As the surface area of the current limiting resistor 2 approaches the surface area of the p-type anode region 13, heat dissipation of the current limiting resistor 2 may be improved.

The poly-silicon layers 21 to 24 each has a part toward a second end thereof in contact with the anode electrode 17a, via the contact hole 18b. The respective contact holes 18b constituting contacts between the anode electrode 17a and the poly-silicon layers 21 to 24 are positioned closer to the poly-silicon connector 20 than is than is the contact hole 18a, and are uniformly disposed an equal distance x2 from the contact hole 18a, as explained later. In particular, the contact holes 18b, for example, are disposed at equal intervals along an inner periphery of the anode electrode 17a.

A length of current path from the contact hole 18c constituting the contact for the limiting resistor electrode 17b and the poly-silicon connector 20, to the contact holes 18b constituting the contacts between the anode electrode 17a and the second ends of the poly-silicon layers 21 to 24 is equal in all of the poly-silicon layers 21 to 24. The distance x1, which is a shortest distance between the contact hole 18c and the contact hole 18b, is equal in all of the poly-silicon layers 21 to 24. Resistance values R21 to 24 of the poly-silicon layers 21 to 24 are each determined by a width w1 described hereinafter and the length of the current path thereof. The resistance values R21 to 24 of the poly-silicon layers 21 to 24 of the poly-silicon layers 21 to 24, for example, is a few Ω to a few hundred Ω. Further, the distance x2 that is the shortest distance from the contact holes 18b constituting the contacts between the anode electrode 17a and the second ends of the poly-silicon layers 21 to 24, to the contact hole 18a constituting the contact for the anode electrode 17a and the p$^+$-type anode contact region 14 is equal in all of the poly-silicon layers 21 to 24.

In other words, a layout of a contact for drawing current from the limiting resistor electrode 17b to the current limiting resistor 2 is uniform. A layout of a contact for drawing current from the current limiting resistor 2 to the bootstrap diode 1 is uniform. As a result, drawing of current passing through the bootstrap diode 1, to the BSC from the rear surface of the semiconductor substrate 10 is uniform. All of the contact holes 18b may have equal planar shapes and surface areas. A planar shape of the contact holes 18b, for example, may be a rectangular or a circular shape. The contact holes 18b, 18c penetrate the interlayer insulating film 16 in the depth direction. In FIGS. 1 and 2, the contact holes 18a, 18c are indicated by thick lines, while the contact holes 18b are indicated by solid rectangles (■).

Further, in each of the poly-silicon layers 21 to 24, the width w1 along a direction (normal direction of the poly-silicon connector 20) orthogonal to a direction (direction indicated by white arrow) in which current flows may be constant along an entire length of a current path in the poly-silicon layers 21 to 24. A current path in the poly-silicon layers 21 to 24, among paths of current flowing from a wire bonded to the limiting resistor electrode 17b and passing through the limiting resistor electrode 17b, the current limiting resistor 2 (the poly-silicon connector 20 and the poly-silicon layers 21 to 24) and the bootstrap diode 1, and flowing toward the BSC from a cathode electrode 30 of the rear surface of the semiconductor substrate 10, is a path of current that flows from the poly-silicon connector 20 and the respective connection sites of the poly-silicon layers 21 to 24 connected in parallel with the poly-silicon connector 20, and that is split to the poly-silicon layers 21 to 24 and flows to the p$^+$-type anode contact region 14.

The anode electrode 17a and the limiting resistor electrode 17b are disposed on the interlayer insulating film 16. The limiting resistor electrode 17b is disposed in the chip center part. The limiting resistor electrode 17b, for example, has a circular planar shape. The limiting resistor electrode 17b opposes, for example, an entire surface of the poly-silicon connector 20 in the depth direction, across the interlayer insulating film 16. The limiting resistor electrode 17b may oppose first ends of the poly-silicon layers 21 to 24 in the depth direction, across the interlayer insulating film 16. Further, the limiting resistor electrode 17b may be connected to a non-depicted internal power source and fixed at the internal power source voltage VCC.

The anode electrode 17a is separated from the limiting resistor electrode 17b and disposed in a ring-shape surrounding a periphery of the limiting resistor electrode 17b. The anode electrode 17a opposes the poly-silicon layer 33a in the depth direction, across the interlayer insulating film 16, the poly-silicon layer 33a that of the poly-silicon layers 33a to 33f described hereinafter, is nearest the chip center part. In FIG. 1, the limiting resistor electrode 17b is a part surrounded by dashed-lined circle, while the anode electrode 17a is a part sandwiched between 2 dashed-lines that are finer than that of the limiting resistor electrode 17b (similarly in FIG. 6).

A periphery of the diode region is surrounded by an edge termination region. The edge termination region is a region between the diode region and a side surface of the semiconductor substrate 10. The edge termination region mitigates electric field of the n$^-$-type drift region 12 on a chip front surface side and sustains breakdown voltage. Breakdown voltage is a voltage limit at which errant operation and damage of an element does not occur. On the front surface of the semiconductor substrate 10, spanning the diode region and the edge termination region, the poly-silicon layers 33a to 33f (herein, 6) are disposed with the insulating film 15 between the poly-silicon layers 33a to 33f and the semiconductor substrate 10. In FIGS. 1 and 2, a case is depicted in which sequentially toward the chip edge, the poly-silicon layers 33a to 33f are disposed (similarly in FIGS. 6 and 7).

The poly-silicon layers 33a to 33f are separated from the current limiting resistor 2 and are disposed in concentric shapes surrounding a periphery of the current limiting resistor 2. Of the poly-silicon layers 33a to 33f, the poly-silicon layer 33a that is nearest the poly-silicon connector 20 is in contact with the anode electrode 17a, via a contact hole 35a. Of the poly-silicon layers 33a to 33f, the poly-silicon layers 33b to 33f excluding the poly-silicon layer 33a nearest the poly-silicon connector 20, are each disposed in the edge termination region to be in contact with a non-depicted FLR 31 and a FP 34 (refer to FIG. 4), via a corresponding contact hole 35b to 35f. In FIGS. 1 and 2, the contact holes 35a to 35f are indicated by thick lines.

Further, in the edge termination region, a poly-silicon layer 42 is provided on the front surface of the semiconductor substrate 10 with the insulating film 15 between the poly-silicon layer 42 and the semiconductor substrate 10. The poly-silicon layer 42 is separated from the poly-silicon layers 33a to 33f and is disposed in a ring-shape surrounding a periphery of the poly-silicon layer 33f that of the poly-silicon layers 33a to 33f, is nearest the chip edge. The poly-silicon layer 42 is in contact with a channel stopper electrode 43 and together with the channel stopper electrode 43 functions as a channel stopper. The channel stopper electrode 43 is in contact with the poly-silicon layer 42 and a p-type channel stopper region 41.

The channel stopper electrode 43 is separated from the FPs 34 described hereinafter and is disposed in a ring-shape surrounding a periphery of the FP 34 that of the plural FPs 34, is nearest the chip edge. In FIG. 1, the channel stopper electrode 43 is a part sandwiched between two dashed-lines that are that are finer than that of the limiting resistor electrode 17b. The p-type channel stopper region 41, at the front surface of the semiconductor substrate 10, is provided nearest the chip edge of the semiconductor substrate 10. The p-type channel stopper region 41 is separated from the FLRs 31 and is disposed in a ring-shape surrounding a periphery of the FLRs 31.

As depicted in FIG. 3, the positive electrode of the bootstrap condenser is connected to a cathode (the cathode electrode 30 in FIG. 4) of the bootstrap diode 1, while a gate of the switching power device of the non-depicted upper arm is connected to the negative electrode of the bootstrap condenser. Between an anode (the anode electrode 17a) of the bootstrap diode 1 and the internal power source, the current limiting resistor 2 is connected in series to the bootstrap diode 1. The current limiting resistor 2 is a combined resistance of the poly-silicon layers 21 to 24 (herein, 4) functioning as poly-silicon resistors. All of the poly-silicon layers 21 to 24 have a first end connected to the internal power source and a second end connected to the anode of the bootstrap diode 1.

In general, in the bootstrap circuit, when the switching device of the upper arm of the half-bridge circuit is in the ON state and the switching device on the low-potential side (lower arm) is in the OFF state, the bootstrap diode 1 conducts, and voltage that is a difference of voltage drops of the current limiting resistor 2 and the bootstrap diode 1 subtracted from the internal power source voltage VCC is charged by the bootstrap condenser. At this time, the switching device of the upper arm does not turn ON because the gate voltage is at zero potential.

Meanwhile, when the switching device of the upper arm of the half-bridge circuit is in the OFF state and the switching device of the lower arm is in the ON state, the gate voltage of the switching device of the upper arm is a voltage value obtained by adding the electric potential of the positive electrode of the bootstrap condenser to the drain voltage VDD of the switching device of the upper arm. As a result, the switching device of the upper arm is completely in the ON state. Operation of a bootstrap circuit such as this is repeatedly performed at a period of switching frequency input to the gate drive circuit.

A charging amount of the bootstrap condenser is determined by a mathematical product (time constant) of a capacity of the bootstrap condenser and a composite resistance value (=the resistance value R1 of the bootstrap diode 1+a composite resistance value of the current limiting resistor 2) of a resistance value R1 of the bootstrap diode 1 and a composite resistance value of the current limiting resistor 2. The composite resistance value of the current limiting resistor 2 is a reciprocal of reciprocals of the resistance values R21 to R24 of the poly-silicon layers 21 to 24 $(=(1/R21+1/R22+1/R23+1/R24)^{-1} \approx R21/4$, $R21 \approx R22 \approx R23 \approx R24)$.

A cross-section of the structure of the semiconductor device according to the first embodiment will be described. As depicted in FIG. 4, the bootstrap diode 1 and the current limiting resistor 2 in FIGS. 1 and 2, for example, are provided with a diode region 51 on the same semiconductor substrate 10. The bootstrap diode 1 is formed by pn junctions of the p-type anode region 13 and the n$^-$-type drift region 12 and the n$^+$-type cathode region 11.

The semiconductor substrate 10 is formed by forming, by epitaxial growth, semiconductor layers that constitute the n$^+$-type cathode region 11 and the n$^-$-type drift region 12. The semiconductor substrate 10 may be formed by forming by epitaxial growth on an n$^+$-type substrate constituting the n$^+$-type cathode region 11, a semiconductor layer constituting the n$^-$-type drift region 12. The semiconductor substrate 10 has, as the front surface, a main surface on a side that includes the n$^-$-type drift region 12 and has, as a rear surface, a main surface on a side that includes the n$^+$-type cathode region 11. The p-type anode region 13 is provided at an entire surface of a surface layer (surface layer of the n$^-$-type drift region 12) at the front surface of the semiconductor substrate 10 in the diode region 51. In the p-type anode region 13, the p$^+$-type anode contact region 14 is selectively provided.

A part of the front surface of the semiconductor substrate 10, the part surrounded by the p$^+$-type anode contact region 14, for example, is covered by the insulating film 15 constituted by an oxide film such as a local insulating film of local oxidation of silicon (LOCOS). On the insulating film 15, the poly-silicon layers 21 to 24 (in FIG. 4, the poly-silicon layer 24 is not depicted) and the poly-silicon connector 20 constituting the current limiting resistor 2 are disposed. The poly-silicon connector 20 is disposed so as to be surrounded by the poly-silicon layers 21 to 24. All of the poly-silicon layers 21 to 24 are connected to the poly-silicon connector 20 by a non-depicted part.

A thickness t1 of the poly-silicon layers 21 to 24, for example, may be in a range from about 0.2 μm to 1 μm and, for example, may be about 0.5 μm. When the thickness t1 of the poly-silicon layers 21 to 24 exceeds the upper limit above, the predetermined resistance values R21 to R24 of the poly-silicon layers 21 to 24 are not obtained. Further, as the thickness t1 of the poly-silicon layers 21 to 24 decreases, a mathematical area of a cross-section of the poly-silicon layers 21 to 24 decreases and therefore, the resistance values R21 to R24 of the poly-silicon layers 21 to 24 increase, and the flow of current in the poly-silicon layers 21 to 24 becomes difficult. When the thickness t1 of the poly-silicon layers 21 to 24 is less than the lower limit above, the current limiting resistor 2 degrades due current to the poly-silicon layers 21 to 24 concentrating.

An end of the p-type anode region 13, the p$^+$-type anode contact region 14, the poly-silicon connector 20, and the poly-silicon layers 21 to 24 are covered by the interlayer insulating film 16. In the interlayer insulating film 16 and the insulating film 15, the contact hole 18a is provided penetrating the interlayer insulating film 16 and the insulating film 15 in the depth direction and reaching the p$^+$-type anode contact region 14. In the interlayer insulating film 16, the contact holes 18b (herein, 4) are provided penetrating the interlayer insulating film 16 in the depth direction. In the contact holes 18b, the second ends of the respective poly-silicon layers 21 to 24 are exposed.

Further, in the interlayer insulating film 16, the contact hole 18c is disposed penetrating the interlayer insulating film 16 in the depth direction and reaching the poly-silicon connector 20. In the contact hole 18c, an outer peripheral part of the poly-silicon connector 20 is exposed. On the interlayer insulating film 16, the anode electrode 17a and the limiting resistor electrode 17b are provided separated from each other. The anode electrode 17a and the limiting resistor electrode 17b, for example, are metal electrodes made of an alloy containing aluminum (Al) and may be, for example, an aluminum-silicon (Al—Si) electrode, an aluminum-copper (Al—Cu) electrode, or an aluminum-silicon-copper (Al—Si—Cu) electrode.

The limiting resistor electrode 17b is in contact with the poly-silicon connector 20, via the contact hole 18c, and is electrically connected to all of the poly-silicon layers 21 to 24 by the poly-silicon connector 20. The limiting resistor electrode 17b and the poly-silicon layers 21 to 24 are electrically connected by the poly-silicon connector 20, thereby enabling the resistance value of the current limiting resistor 2 to be reduced. A part of the poly-silicon connector 20 surrounded by the contact hole 18c, for example, functions as a cushioning material for reducing impact of ultrasonic vibration, etc. on the semiconductor substrate 10 when a bonding wire is bonded to the limiting resistor electrode 17b.

The limiting resistor electrode 17b and all of the poly-silicon layers 21 to 24 suffice to be electrically connected by the poly-silicon connector 20, and configuration may be such that a poly-silicon connector 20' is disposed only directly beneath the contact hole 18c (refer to FIG. 5). Directly beneath the contact hole 18c is a part on the insulating film 15, exposed by the contact hole 18c. When the poly-silicon connector 20' is disposed only directly beneath the contact hole 18c, a planar shape of the poly-silicon connector 20' is a substantially ring-shape.

In an edge termination region 52, in the surface layer (surface layer of the n⁻-type drift region 12) on the front surface of the semiconductor substrate 10, the field limiting rings (FLRs) 31 that are floating p-type regions and the p-type channel stopper region 41 are each selectively provided. The FLRs 31 are disposed separated from the p-type anode region 13. Further, while not depicted the FLRs 31 are disposed in concentric shapes surrounding a periphery of the p-type anode region 13.

In each of the FLRs 31, a p⁺-type contact region 32 is selectively provided. While not depicted, the p⁺-type contact regions 32 are each disposed in a ring-shape along the FLR 31 in which the p⁺-type contact region 32 is provided. The p-type channel stopper region 41 is selectively provided in the surface layer at the front surface of the semiconductor substrate 10, closer to the chip edge than are the FLRs 31. Further, the p-type channel stopper region 41 is provided separated from the FLRs 31 and is disposed so as to be exposed at the side surface of the semiconductor substrate 10.

In the edge termination region 52, the front surface of the semiconductor substrate 10 is covered by the insulating film 15. The poly-silicon layers 33a to 33f are provided on the insulating film 15, the poly-silicon layers 33a to 33f being provided separated from the current limiting resistor 2 and closer to the chip edge than is the current limiting resistor 2. The poly-silicon layers 33a to 33f are covered by the interlayer insulating film 16, and on the interlayer insulating film 16, the field plates (FPs) 34 are provided. In the interlayer insulating film 16 in the edge termination region 52, the contact hole 35a is provided penetrating the interlayer insulating film 16 in the depth direction and reaching the poly-silicon layer 33a that of the poly-silicon layers 33a to 33f, is nearest the poly-silicon connector 20.

Further, in the interlayer insulating film 16 and the insulating film 15 in the edge termination region 52, the contact holes 35b to 35f are each provided penetrating in the depth direction, the interlayer insulating film 16, a respective poly-silicon layer opposing in the depth direction among the poly-silicon layers 33b to 33f, and the insulating film 15; the contact holes 35b to 35f respectively reaching the p⁺-type contact regions 32. In the contact holes 35b to 35f, the p⁺-type contact regions 32 are respectively exposed. The poly-silicon layers 33a to 33f are disposed separated from each other. A thickness t2 of the poly-silicon layers 33a to 33f, for example, may be equal to the thickness t1 of the poly-silicon layers 21 to 24 constituting the current limiting resistor 2.

Of the poly-silicon layers 33a to 33f, the poly-silicon layer 33a that is nearest the poly-silicon connector 20, for example, is disposed in the diode region 51 and opposes the p-type anode region 13 in the depth direction, across the insulating film 15. Further, the poly-silicon layer 33a that is nearest the poly-silicon connector 20 opposes the anode electrode 17a in the depth direction, across the interlayer insulating film 16, and is in contact with the anode electrode 17a via the contact hole 35a. Of the poly-silicon layers 33a to 33f, the poly-silicon layers 33b to 33f excluding the poly-silicon layer 33a that is nearest the poly-silicon connector 20 are disposed in the edge termination region 52.

Of the poly-silicon layers 33a to 33f, the poly-silicon layers 33b to 33f excluding the poly-silicon layer 33a that is nearest the poly-silicon connector 20, respectively oppose the FLRs 31 in the depth direction, across the insulating film 15 and respectively oppose the FPs 34 in a direction opposite the depth direction, across the interlayer insulating film 16. Further, the poly-silicon layers 33b to 33f, via the contact holes 35b to 35f, are in contact with the FLRs 31 and the FPs 34 respectively opposing the poly-silicon layers 33b to 33f in the depth direction. The poly-silicon layers 33b to 33f function as FPs together with the FPs 34.

Between the p-type channel stopper region 41 and the FLR 31 that of the FLRs 31, is nearest the chip edge, the front surface of the semiconductor substrate 10, for example, is covered by the insulating film 15 that is a LOCOS film, or the like. On the insulating film 15, the poly-silicon layer 42 is provided separated from the poly-silicon layers 33b to 33f. The channel stopper electrode 43 is provided on the interlayer insulating film 16 that covers the poly-silicon layer 42 and is in contact with the poly-silicon layer 42 and the p-type channel stopper region 41, via a contact hole. The poly-silicon layer 42 functions as a channel stopper electrode together with the channel stopper electrode 43.

The FPs 34 and the channel stopper electrode 43, for example, are a same metal electrode as the anode electrode 17a. A passivation film 19 is provided so as to cover the FPs 34 and the channel stopper electrode 43. The passivation film 19 may extend from the edge termination region 52 to on top a surface of the limiting resistor electrode 17b. The n⁺-type cathode region 11 of the bootstrap diode 1 forms the rear surface of the semiconductor substrate 10. The cathode electrode 30 is provided on the entire rear surface of the semiconductor substrate 10 and is connected to the n⁺-type cathode region 11. The cathode electrode 30 is electrically connected to the positive electrode of the bootstrap condenser.

As described, according to the first embodiment, the poly-silicon layer functioning as a poly-silicon resistor of the current limiting resistor is separated into plural layers, where the first ends of the poly-silicon layers are connected to the poly-silicon connector that is a connector providing connection with the limiting resistor electrode, and the seconds end of the poly-silicon layers are connected to the p-type anode region of the bootstrap diode. As a result, between the limiting resistor electrode and the p-type anode region of the bootstrap diode, plural current paths (hole movement path) are formed in parallel by the poly-silicon layers. As a result, current may flow uniformly in all of the poly-silicon layers functioning as the poly-silicon resistors of the current limiting resistor, whereby in the current limiting resistor, sites where electrons locally concentrate do not exist. Therefore, local increases in the amount of heat generated by the current limiting resistor may be suppressed, enabling decreases in the accuracy of the resistance value of the current limiting resistor to be suppressed. Further, according to the first embodiment, the poly-silicon layers functioning as the poly-silicon resistors of the current limiting resistor are each disposed from a part thereof connected to the poly-silicon connector, in a substantially curved planar shape so as to surround a periphery of the poly-silicon connector, enabling a long current path to be established and a high resistance of the poly-silicon resistor to be set.

Figure 6:
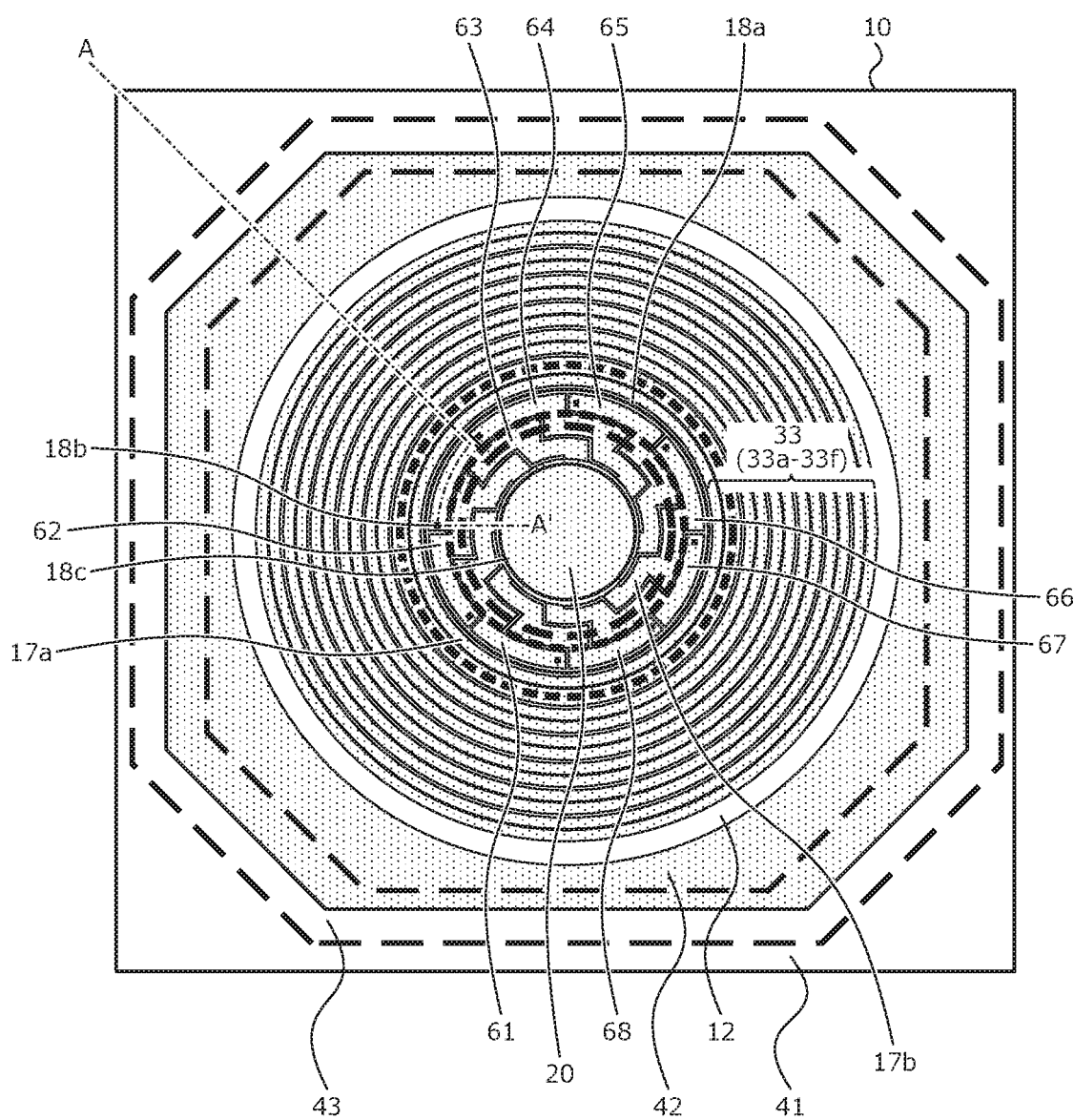
FIG. 6 is a plan view of a structure of the semiconductor device according to a second embodiment.
Figure 7:
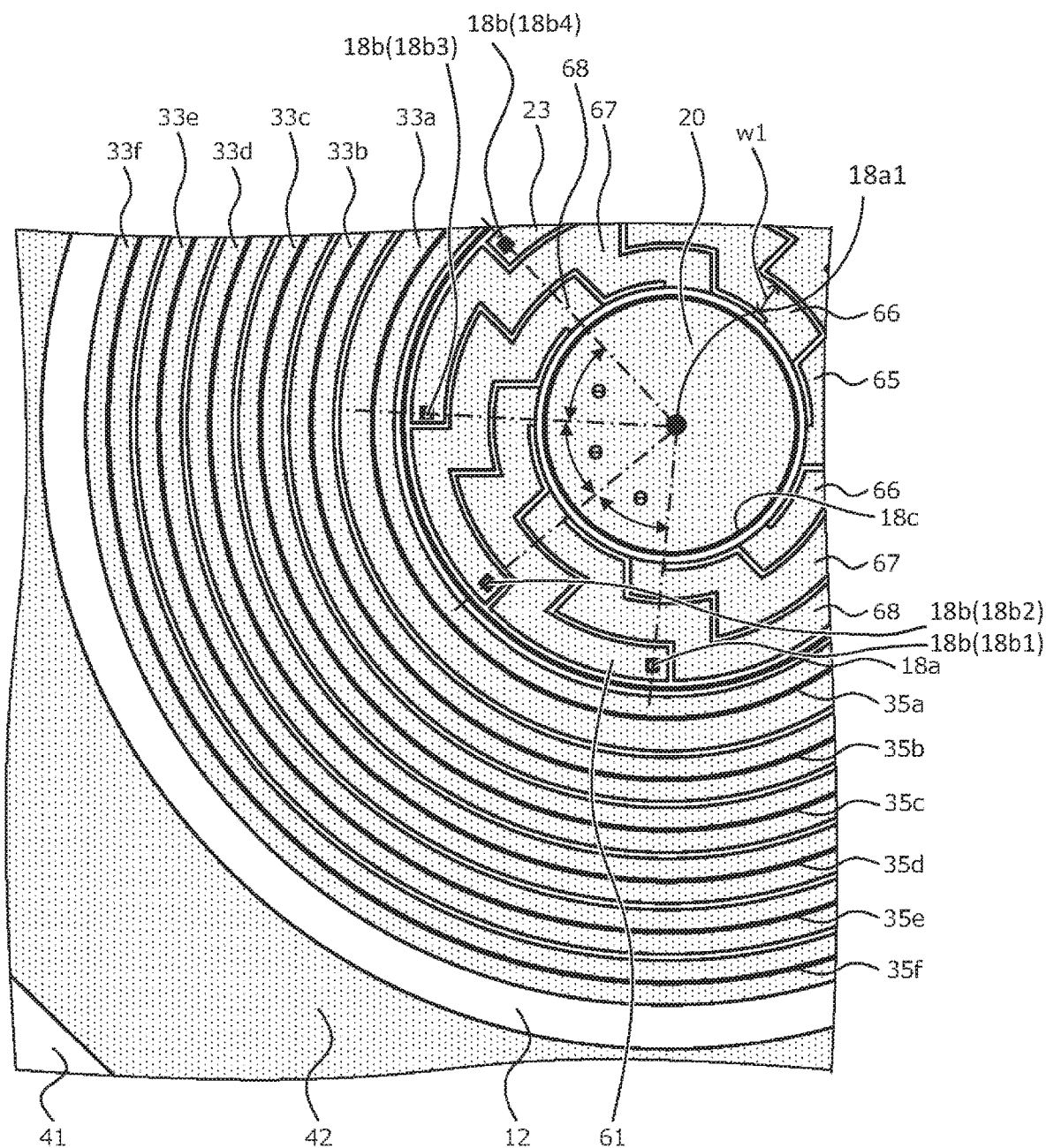
FIG. 7 is an enlarged plan view of a part of FIG. 6.
Figure 8:
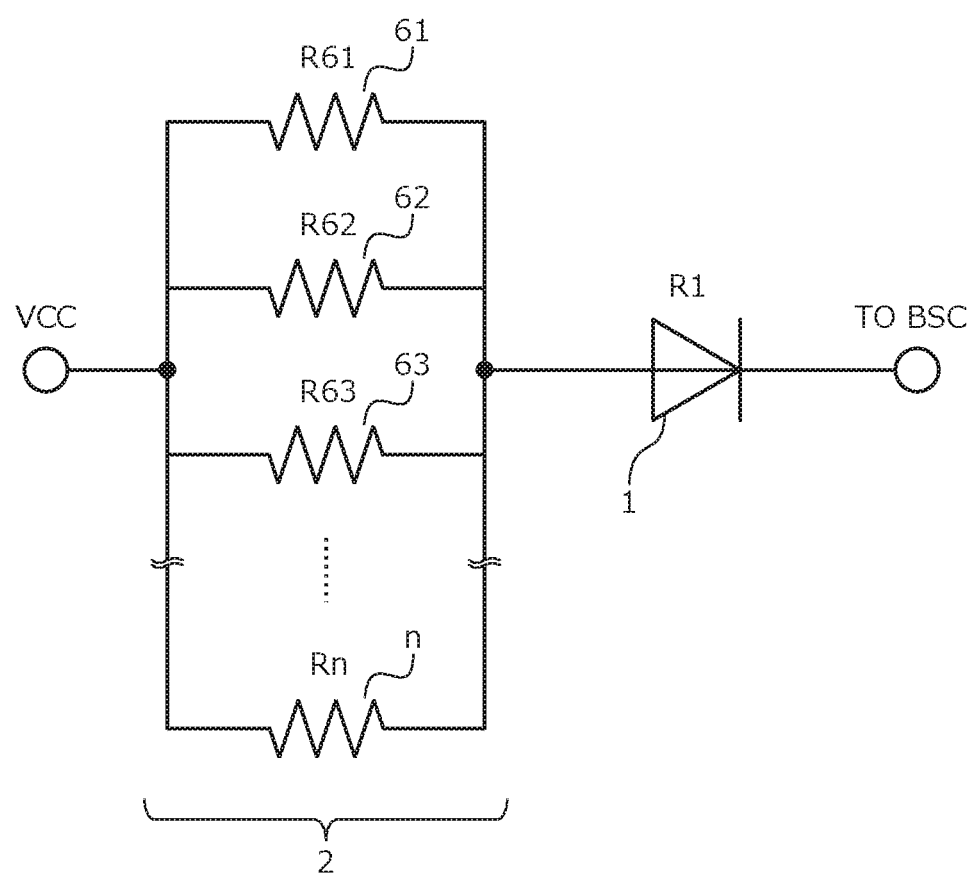
FIG. 8 is a circuit diagram of an equivalent circuit of the semiconductor device according to the second embodiment.

A structure of the semiconductor device according to a second embodiment will be described. FIG. 6 is a plan view of a structure of the semiconductor device according to the second embodiment. FIG. 7 is an enlarged plan view of a part of FIG. 6. In FIG. 7, a part of the current limiting resistor 2 in FIG. 6 is depicted enlarged. FIG. 8 is a circuit diagram of an equivalent circuit of the semiconductor device according to the second embodiment. In FIG. 8, equivalent circuits of the bootstrap diode 1 and the current limiting resistor 2 in FIG. 6 are depicted.

As shown in FIG. 7, the contact holes (second connectors) 18b (hereinafter, also referred to as contact holes 18b1, 18b2, 18b3, 18b4) are respectively disposed inside the ring of the contact hole (first connector) 18a with the same interval one another, i.e., between adjacent two contact holes 18b (between contact holes 18b1 and 18b2, 18b2 and 18b3, 18b3 and 18b4). 18a1 in FIG. 7 shows a center of the contact hole 18a. An area ratio between the contact hole 18a and the contact holes 18b in a plan view of the semiconductor device is the same in any circular sector having the same central angle, such as θ. θ may correspond to an angle between an adjacent two contact holes 18b. Further, as explained earlier, the contact hole (third connector) 18c has the ring shape, and an area ratio between the contact hole 18a and the contact hole 18c in a plan view of the semiconductor device is the same in any circular sector having the same central angle, such as θ. These features as to the first to third contact holes 18a-18c may be included not only in the second embodiment, but also in the first and third embodiments.

The semiconductor device according to the second embodiment differs from the semiconductor device according to the first embodiment in that the poly-silicon layer constituting the current limiting resistor 2 is further separated, increasing a count of poly-silicon layers 61 to n (where, n=62, 63, 64, . . . ) connected in parallel between the limiting resistor electrode 17b and the bootstrap diode 1, and functioning as poly-silicon resistors of the current limiting resistor 2.

In FIGS. 6 and 7, for example, while one example of an instance is depicted in which 8 of the poly-silicon layers functioning as the poly-silicon resistors of the current limiting resistor 2 are disposed (i.e., n=68), the count of the poly-silicon layer functioning as the poly-silicon resistors of the current limiting resistor 2 may be variously changed. Configuration of the semiconductor device according to the second embodiment, excluding the count and layout of the poly-silicon layers 61 to 68, is similar to that of the semiconductor device according to the first embodiment.

In the second embodiment, the eight poly-silicon layers 61 to 68, similarly to the first embodiment, are disposed in a substantially curved planar layout so as to surround a periphery of the poly-silicon connector 20 from respective parts of the poly-silicon layers 61 to 68 connected to the poly-silicon connector 20. As a result, similarly to the first embodiment, between the limiting resistor electrode 17b and the p-type anode region 13 of the bootstrap diode 1, 8 current paths (hole movement path) are formed in parallel by the poly-silicon layers 61 to 68.

The width w1 of the poly-silicon layers 61 to 68 and a length of the current paths are adjusted, whereby the layout of the poly-silicon layers 61 to 68 may be variously changed. Therefore, by adjusting the width w1 of the poly-silicon layers 61 to 68 and the length of the current paths, degrees of freedom in the design of the current limiting resistor 2 are enhanced. As a result, chip size may be reduced; and when chip size is not changed, resistance values R61 to R68 of the poly-silicon layers 61 to 68 may be adjusted.

As described, according to the second embodiment, even when the count of the poly-silicon layers functioning as the poly-silicon resistors of the current limiting resistor is increased, effects similar to those of the first embodiment may be obtained.

Figure 9:
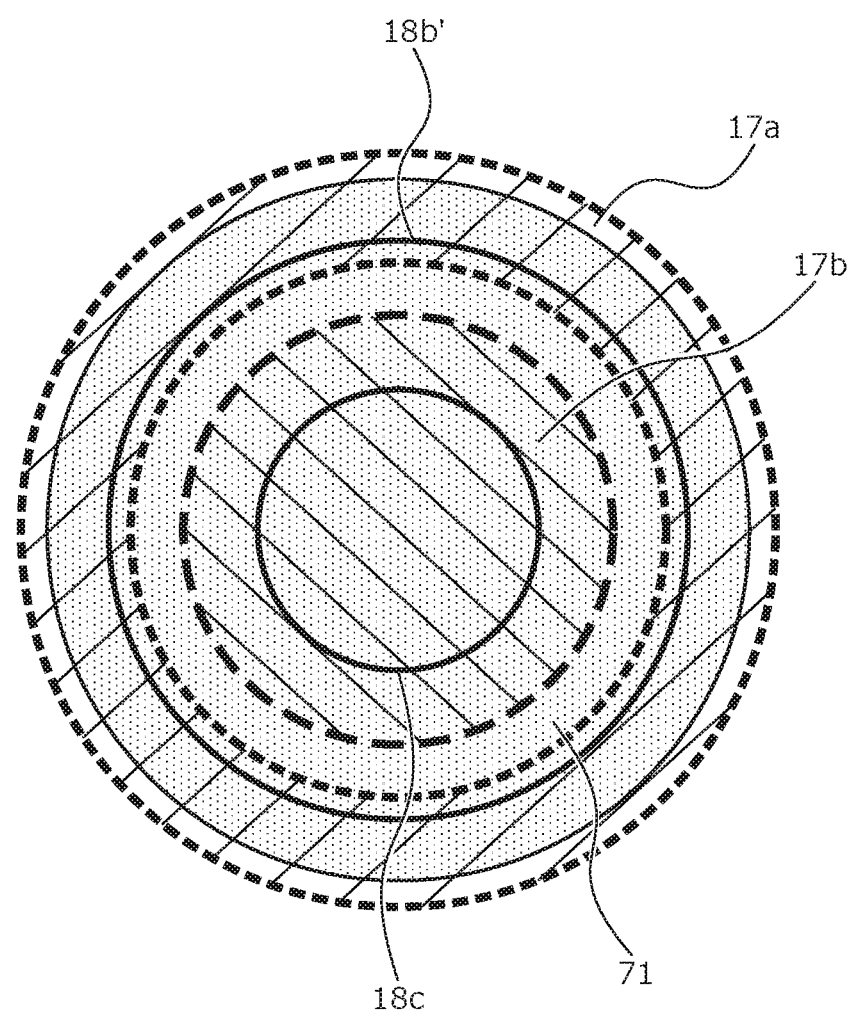
FIG. 9 is a plan view of the semiconductor device according to a third embodiment as viewed from the front surface of the semiconductor substrate.
Figure 10:
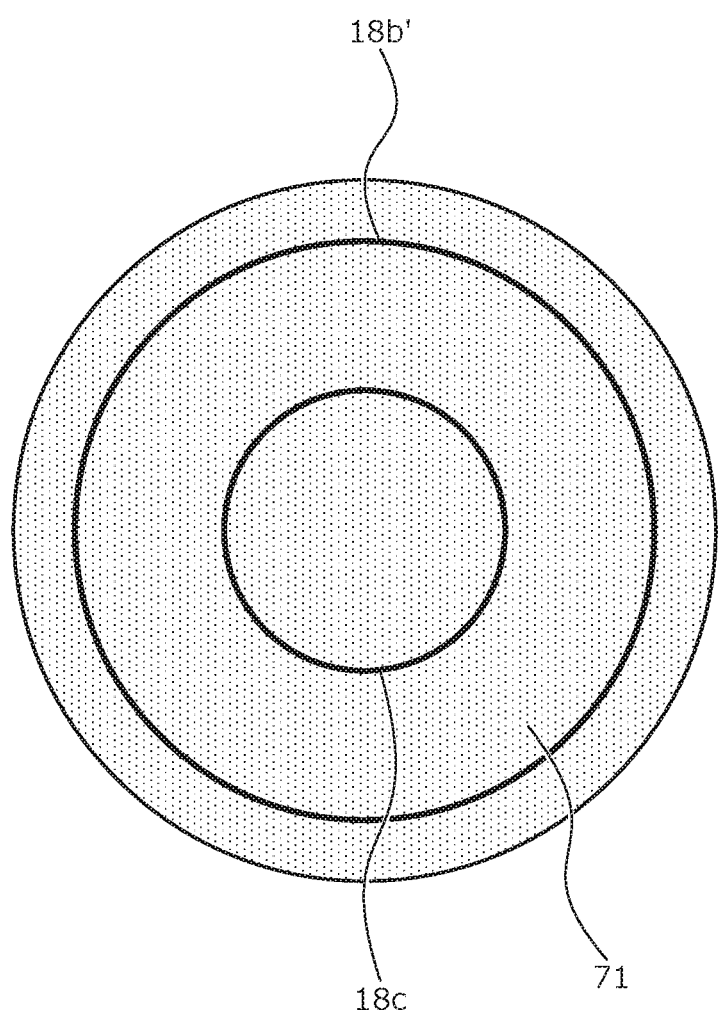
FIG. 10 is a plan view of a part of FIG. 9.
Figure 11:
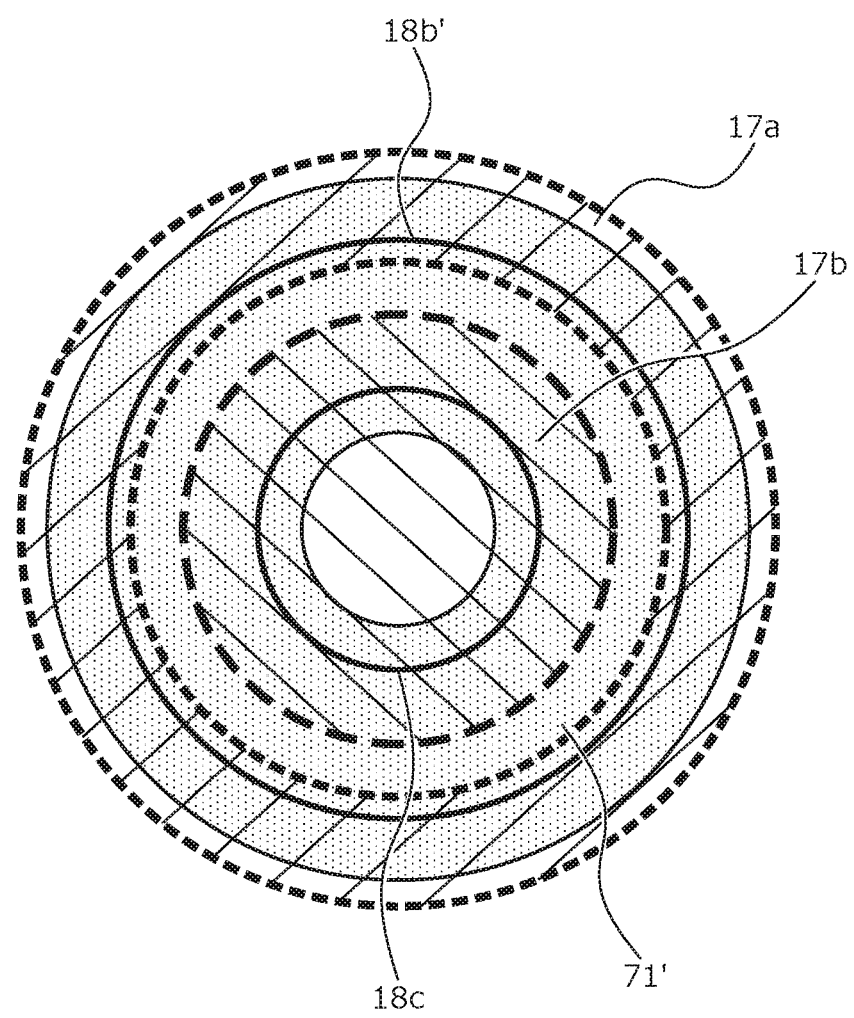
FIG. 11 is a plan view of the semiconductor device according to the third embodiment as viewed from the front surface of the semiconductor substrate.
Figure 12:
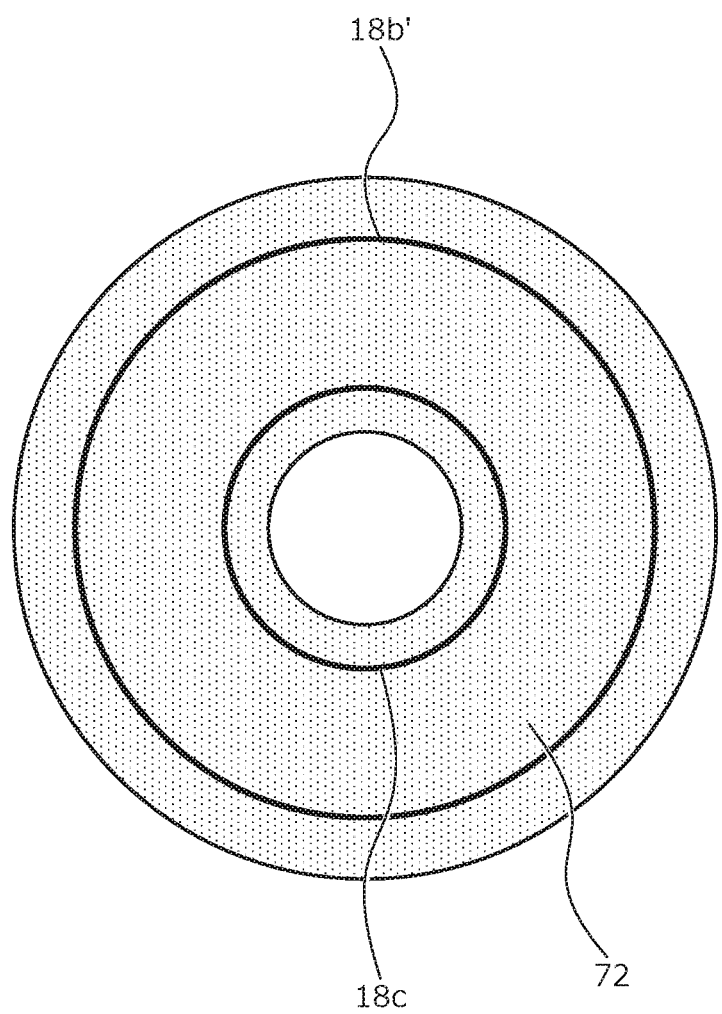
FIG. 12 is a plan view of a part of FIG. 11.
Figure 13:
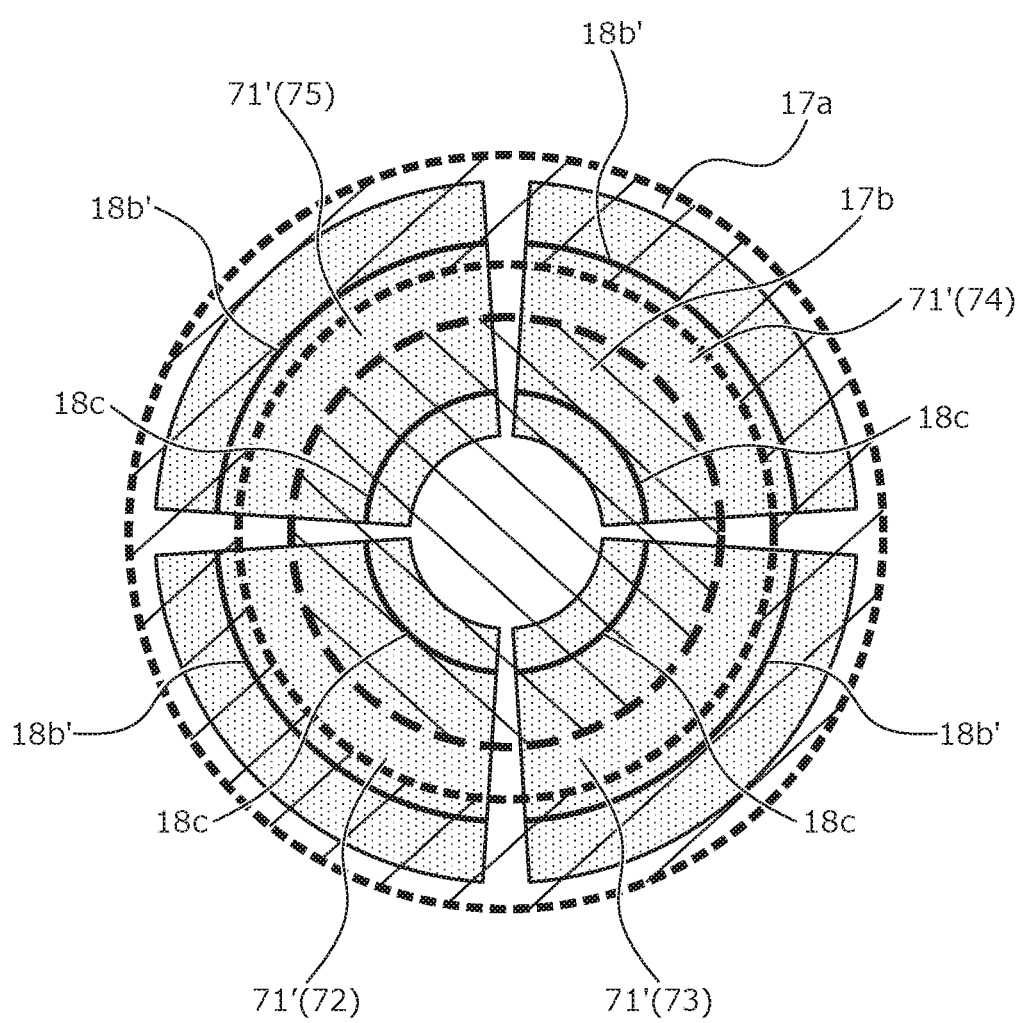
FIG. 13 is a plan view of the semiconductor device according to the third embodiment as viewed from the front surface of the semiconductor substrate.
Figure 14:
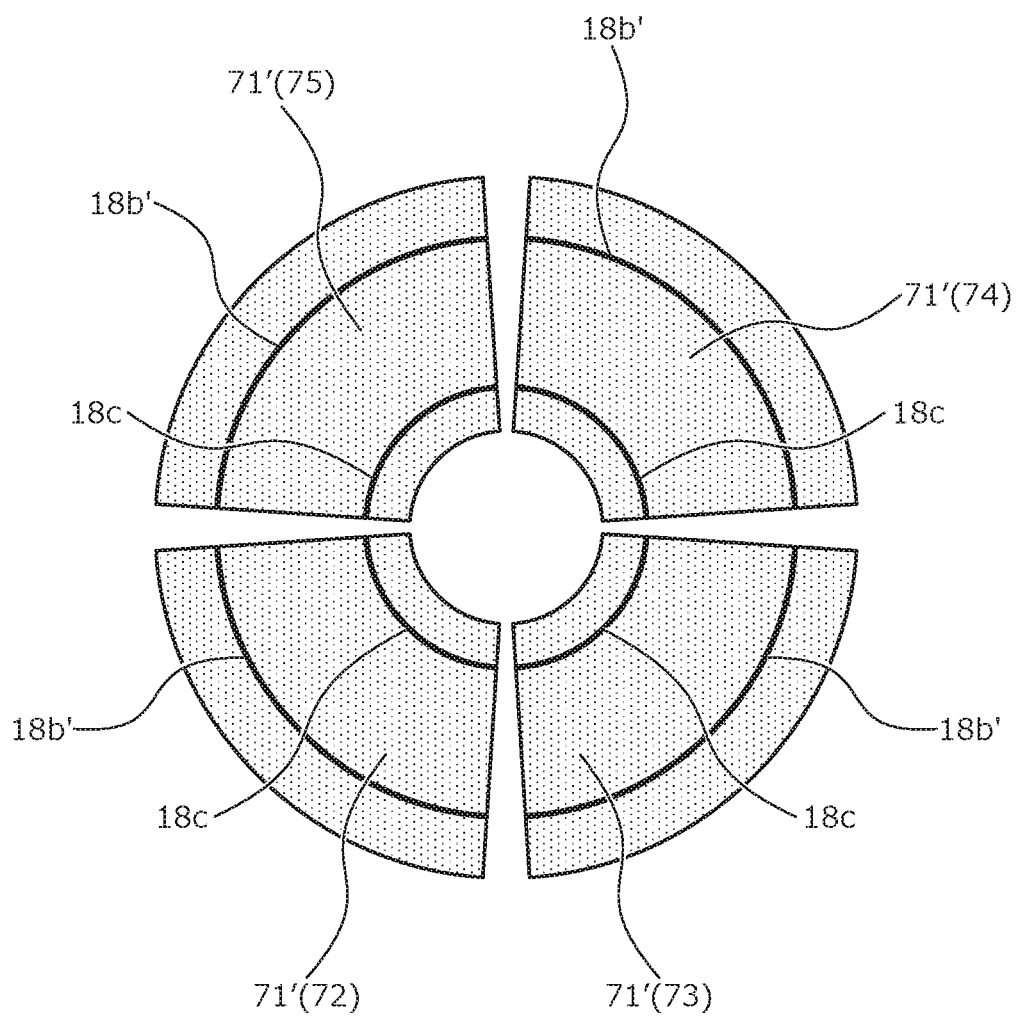
FIG. 14 is a plan view of a part of FIG. 13.
Figure 15:
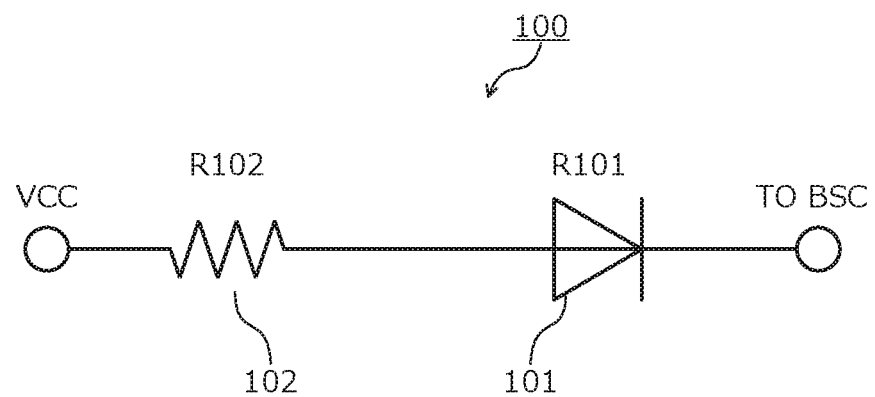
FIG. 15 is a circuit diagram of an equivalent circuit of some components of a general bootstrap circuit.
Figure 16:
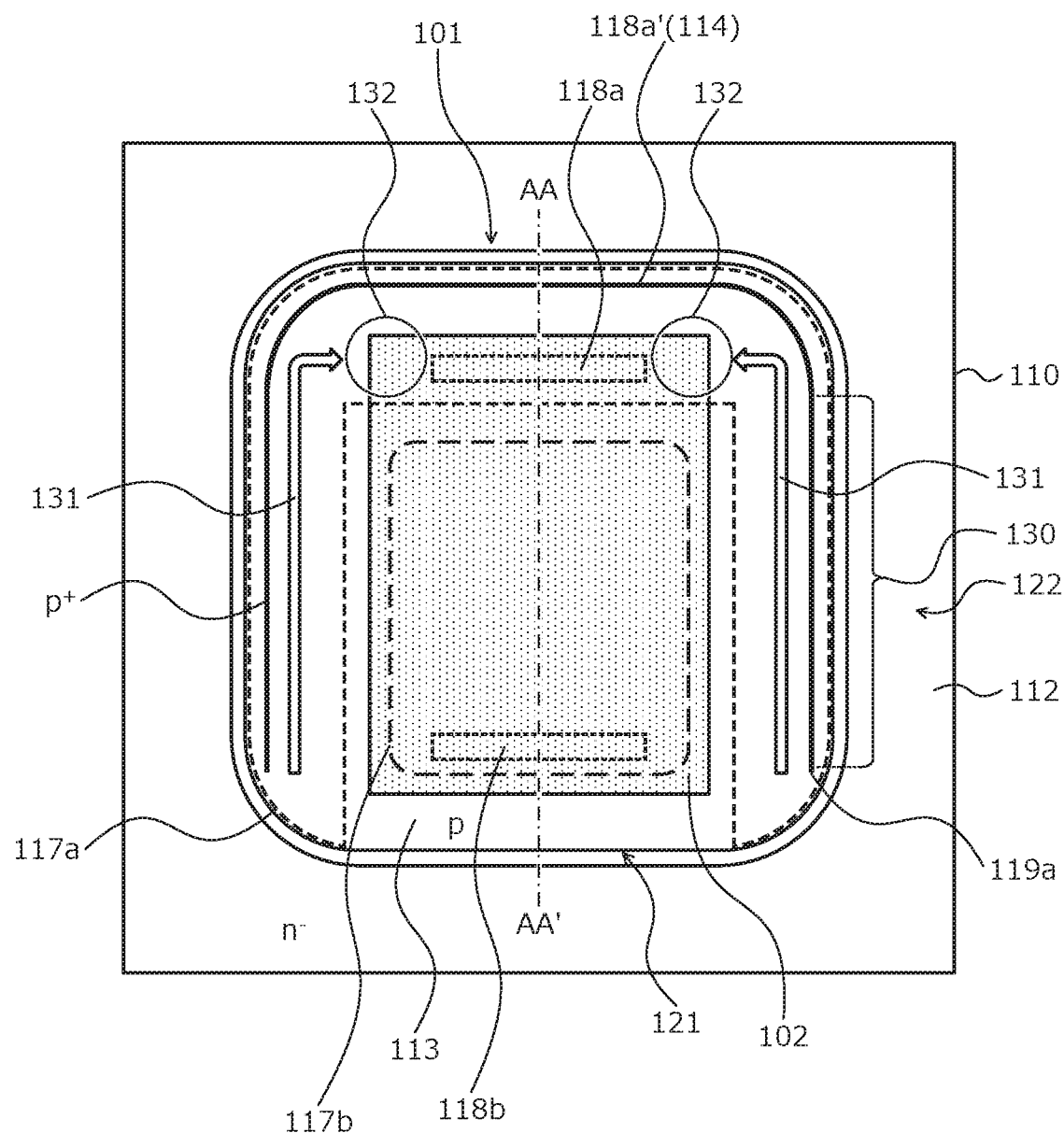
FIG. 16 is a plan view of a structure of a bootstrap diode and a current limiting resistor of a conventional bootstrap circuit as viewed from a front surface of a semiconductor substrate.
Figure 17:
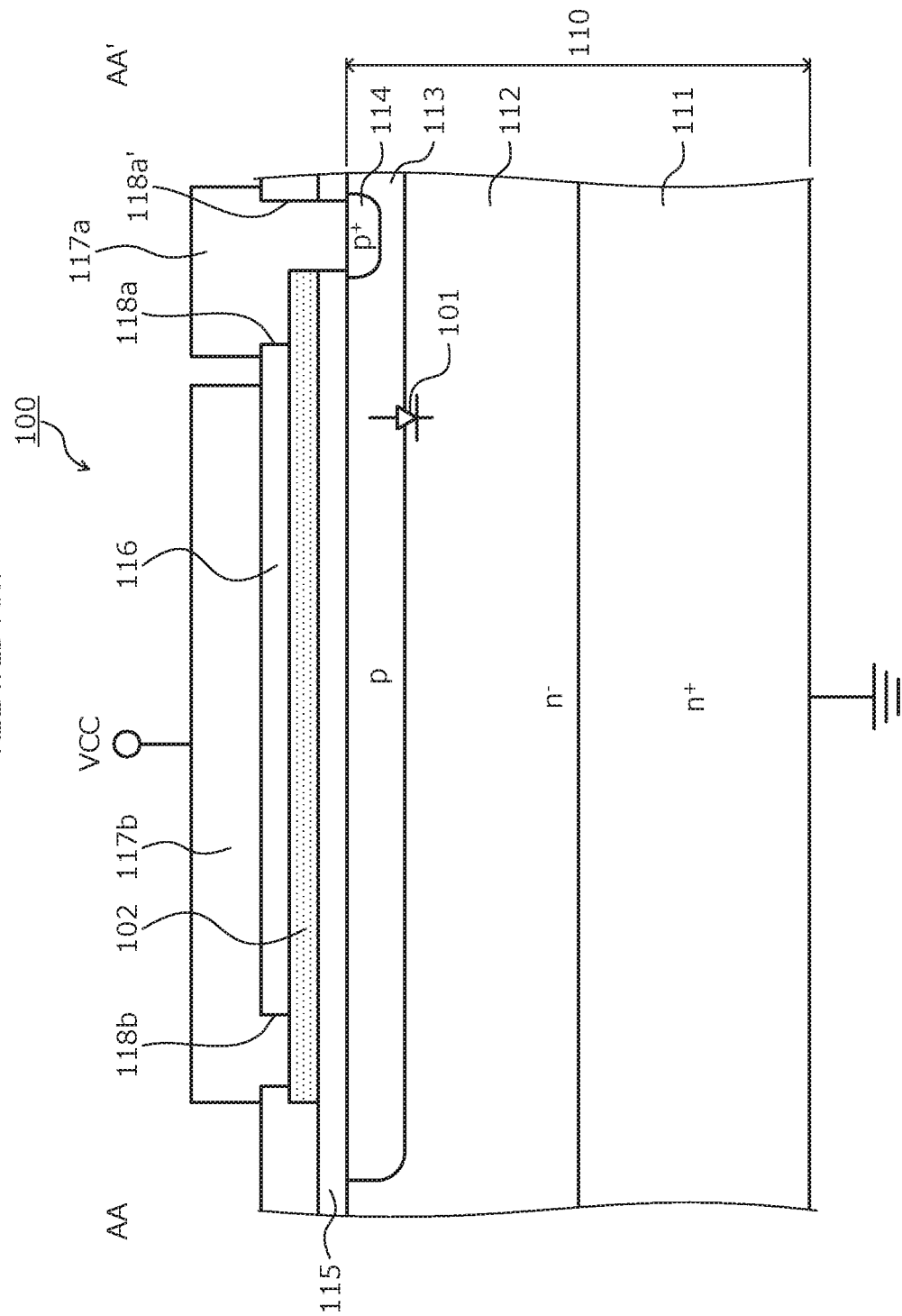
FIG. 17 is a cross-sectional view along cutting line AA-AA' depicted in FIG. 16.

A structure of the semiconductor device according to a third embodiment will be described. FIGS. 9, 11, and 13 are plan views of the semiconductor device according to the third embodiment as viewed from the front surface of the semiconductor substrate. FIGS. 10, 12, and 14 are respectively plan views of a part of FIGS. 9, 11, and 13. In FIGS. 10, 12, and 14, only the contact holes 18b, 18c, and poly-silicon layers functioning as the poly-silicon resistors of the current limiting resistor 2 in FIGS. 9, 11, and 13 are depicted, respectively.

The semiconductor device according to the third embodiment includes the current limiting resistor 2 that is configured by 1 or more poly-silicon layers serving as the poly-silicon connector and the poly-silicon resistors. In other words, provided a path (hole movement path) of current flowing from the limiting resistor electrode 17b, toward the bootstrap diode 1 is formed uniformly by the poly-silicon layer(s) constituting the current limiting resistor 2, the planar shape of the poly-silicon layer(s) constituting the current limiting resistor 2 may be variously changed.

In particular, as depicted in FIGS. 9 and 10, as the current limiting resistor 2, a poly-silicon layer 71 having a substantially circular planar shape may be disposed. The poly-silicon layer 71 opposes the anode electrode 17a and the limiting resistor electrode 17b in the depth direction, across the interlayer insulating film. The poly-silicon layer 71 is in contact with the anode electrode 17a via a contact hole 18b', and is in contact with the limiting resistor electrode 17b via the contact hole 18c. In other words, the poly-silicon layer 71 constituting the current limiting resistor 2 serves as the poly-silicon connector and the poly-silicon resistor of the first embodiment and is not separated into plural layers.

The contact hole 18b' constituting a contact for the anode electrode 17a and the poly-silicon layer 71 is larger than the inner diameter of the anode electrode 17a and is disposed in a substantially ring-shape having a diameter that is smaller than a diameter of the poly-silicon layer 71. The contact hole 18c constituting a contact for the limiting resistor electrode 17b and the poly-silicon layer 71 is disposed in a substantially ring-shape having a diameter that is smaller than the diameter of the limiting resistor electrode 17b. The diameter of the poly-silicon layer 71 is larger than the diameter of the contact hole 18b'. The diameter of the poly-silicon layer 71 may be smaller than the outer diameter of the anode electrode 17a.

As depicted in FIGS. 11 and 12, the planar shape of the poly-silicon layer 71' constituting the current limiting resistor 2 may be a substantially ring-shape. In this case, the contact hole 18b' constituting the contact for the anode electrode 17a and the poly-silicon layer 71' is larger than the inner diameter of the anode electrode 17a and is disposed in a substantially ring-shape having a diameter that is smaller than an outer diameter of the poly-silicon layer 71'. The contact hole 18c constituting the contact for the limiting resistor electrode 17b and the poly-silicon layer 71' is smaller than the diameter of the limiting resistor electrode 17b and is disposed in a substantially ring-shape having a diameter that is larger than an inner diameter of the poly-silicon layer 71'. Configuration of the semiconductor device according to the third embodiment depicted in FIGS. 11 and 12, excluding the planar shape of the poly-silicon layer 71', is similar to that of the semiconductor device according to the third embodiment depicted in FIGS. 9 and 10.

Further, as depicted in FIGS. 13 and 14, the current limiting resistor 2 may be constituted by plural (herein, 4) poly-silicon layers 72 to 75 obtained by separating the poly-silicon layer 71' having a substantially ring-shape planar layout into fan-like planar shapes centered about a center of the poly-silicon layer 71'. In this case, the poly-silicon layers 72 to 75 are disposed separated from each other. The contact holes 18b' constituting the contacts between the anode electrode 17a and the poly-silicon layers 72 to 75, and the contact holes 18c constituting the contacts between the limiting resistor electrode 17b and the poly-silicon layer 71' are separated into a substantially arc-shape opposing only the poly-silicon layers 72 to 75 having a fan-like planar shape. Configuration of the semiconductor device according to the third embodiment depicted in FIGS. 13 and 14 excluding the planar shape of the poly-silicon layers 72 to 75 is similar to that of the semiconductor device according to the third embodiment depicted in FIGS. 11 and 12.

In FIGS. 9, 11, and 13, the poly-silicon layers 71, 71', 72 to 75 functioning as poly-silicon resistors of the current limiting resistor 2 are parts hatched with dots. The limiting resistor electrode 17b is indicated by a part surrounded by a dashed-lined circle and hatched with lines sloping downward to the right. The anode electrode 17a is indicated by a part hatched with diagonal lines sloping upward to the right, the part being between 2 dashed lines that are finer than that for the limiting resistor electrode 17b. The contact holes 18b' and 18c are indicated by a thick solid line.

As described, according to the third embodiment, current may flow uniformly in one or more poly-silicon layers serving as a poly-silicon connector and a poly-silicon resistor and therefore, effects similar to those of the first and the second embodiments are obtained.

Further, while not depicted, the planar shape of the bootstrap diode 1 (i.e., the planar shape of the p-type anode region 13) may be substantially rectangular. In this case, the poly-silicon connector of the current limiting resistor 2, for example, is formed in a rectangular planar shape. The poly-silicon layers functioning as the poly-silicon resistors of the current limiting resistor 2 may be disposed in a rectangular and overlapping layout surrounding a periphery of the poly-silicon connector. Further, the poly-silicon layers functioning as the poly-silicon resistors of the current limiting resistor 2 may each have a zigzag planar shape having portions where linear parts are connected and locally curved, in a layout so as to extend away from the poly-silicon connector, toward the chip edge, in a spiral-shape originating at the part thereof connected to the poly-silicon connector and terminating at the contact hole connecting the anode electrode.

In the present invention, without limitation to the embodiments above, various modifications within a range not departing from the spirit of the invention are possible. For example, in the embodiments above, while the metal electrode (anode electrode, limiting resistor electrode and FP) is provided so as to be embedded in the contact hole, without limitation hereto, a barrier metal or a plug may be embedded in the contact hole, and through the barrier metal or plug in the contact hole, the metal electrode may be electrically connected to corresponding components. Further, on the single semiconductor substrate of the bootstrap diode and the current limiting resistor, elements and/or circuits other than the bootstrap diode and the current limiting resistor may be mounted.

According to the embodiments of the present invention, current may flow uniformly in the poly-silicon layer functioning as the poly-silicon resistor of the current limiting resistor, whereby in the current limiting resistor, sites where electrons locally concentrate do not exist. Therefore, local increases in the amount of heat generated by the current limiting resistor may be suppressed.

The semiconductor device according to the embodiments of the present invention achieve an effect in that in a semiconductor device including a current limiting resistor and a bootstrap diode constituting a bootstrap circuit, decreases in the accuracy of the resistance value of the current limiting resistor may be suppressed.

As described, the semiconductor device according to the embodiments of the present invention is useful in power semiconductor devices used in power converting equipment such as inverters and in power supply devices of various types of industrial machines as well as in inverters and the like for automobiles.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor device, comprising:
   a semiconductor substrate of a first conductivity type
   a first semiconductor region of a second conductivity type selectively provided in a surface layer at a front surface of the semiconductor substrate;
   a second semiconductor region of the first conductivity type, the second semiconductor region being a part of the semiconductor substrate excluding the first semiconductor region;
   a bootstrap diode formed by a pn junction between the first semiconductor region and the second semiconductor region;
   an insulating layer covering the front surface of the semiconductor substrate;
   a poly-silicon layer provided in the insulating layer, the poly-silicon layer facing the first semiconductor region;
   a first electrode in contact with the first semiconductor region and the poly-silicon layer;
   a second electrode in contact with the poly-silicon layer;
   a third electrode provided on a rear surface of the semiconductor substrate, the third electrode being in contact with the second semiconductor region;
   a first connector connecting the first electrode to the first semiconductor region, and being disposed in a ring shape surrounding a periphery of the poly-silicon layer,
   a second connector connecting the first electrode to the poly-silicon layer, and being disposed inside a ring of the first connector, and
   a third connector connecting the second electrode to the poly-silicon layer, and being disposed further inside than the second connector.

2. The semiconductor device according to claim 1, wherein
   the second connector includes a plurality of second connectors, each of which is disposed inside the ring of the first connector with the same interval between one another.

3. The semiconductor device according to claim 1, wherein
   the second connector includes a plurality of second connectors, and
   an area ratio between the first connector and the second connector in a plan view of the semiconductor device is the same in any circular sector having the same central angle.

4. The semiconductor device according to claim 1, wherein
   the third connector has a ring shape, and
   an area ratio between the first connector and the third connector in a plan view of the semiconductor device is the same in any circular sector having the same central angle.

5. The semiconductor device according to claim 1, wherein
   the second connector includes a plurality of second connectors,
   the poly-silicon layer has
      a first poly-silicon part connecting the third connector to the second electrode, and
      a plurality of second poly-silicon parts disposed around the first poly-silicon part, each of the plurality of second poly-silicon parts having an inside end and an outside end, and being connected to a corresponding one of the plurality of the second connectors that are respectively connected to the first electrode at the outside end, the inside end being connected to the first poly-silicon part.

6. The semiconductor device according to claim 5, wherein a width of each of the plurality of second poly-silicon parts is constant from a connection site connected to the first poly-silicon part to the second connector.

7. The semiconductor device according to claim 5, wherein the plurality of second poly-silicon parts are connected in parallel between the third connector and the second connector.

8. The semiconductor device according to claim 5, wherein
   the first poly-silicon part has a circular planar shape, and
   each of the plurality of second poly-silicon parts extends spirally outward from a start point to an end point, the start point being connected with the first poly-silicon part, the end point being the second connector, said each of the plurality of second poly-silicon parts surrounding a periphery of the first poly-silicon part.

9. The semiconductor device according to claim 1, wherein the second connector includes a plurality of second connectors, each of the plurality of second connectors being the same distance from the first connector in a plan view of the semiconductor device.

10. The semiconductor device according to claim 1, wherein the third connector includes a plurality of third connectors, each of the plurality of third connectors being the same distance from the second connector in a plan view of the semiconductor device.

11. The semiconductor device according to claim 1, wherein
   the poly-silicon layer has a circular planar shape,
   the second connector includes a plurality of second connectors,
   each of the plurality of second connectors, in a plan view of the semiconductor device, being the same distance from the first connector and having a ring shape, and
   the third connector includes a plurality of third connectors, each of the plurality of third connectors, in the plan view, being the same distance from the second connector and having a ring shape.

12. The semiconductor device according to claim 11, wherein
   the poly-silicon layer includes
      a first part that has the circular planar shape, and
      a second part that has a ring planar shape and is disposed around the first polysilicon part, and
   the third connector is positioned inside of the first poly-silicon part in a plan view of the semiconductor device.

13. The semiconductor device according to claim 12, wherein the poly-silicon layer is separated into a plurality of pieces, each of which has a fan-like planar shape.

14. The semiconductor device according to claim 1, wherein a surface area of the poly-silicon layer has a surface area size that is at least 40% of a surface area size of the first semiconductor region.

15. The semiconductor device according to claim 14, wherein the surface area size of the poly-silicon layer is equal to the surface area size of the first semiconductor region.

* * * * *